United States Patent
Gwon et al.

(10) Patent No.: US 10,386,956 B2
(45) Date of Patent: *Aug. 20, 2019

(54) ORGANIC LIGHT-EMITTING DISPLAY PANEL AND ORGANIC LIGHT-EMITTING DISPLAY DEVICE HAVING BUILT-IN TOUCHSCREEN

(71) Applicant: LG Display Co., Ltd., Seoul (KR)

(72) Inventors: Hyangmyoung Gwon, Paju-si (KR); SeungHee Nam, Paju-si (KR); Kwon-Shik Park, Seoul (KR); DeukSu Lee, Goyang-si (KR); BuYeol Lee, Goyang-si (KR); SuChang An, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/391,625

(22) Filed: Dec. 27, 2016

(65) Prior Publication Data

US 2018/0088726 A1    Mar. 29, 2018

(30) Foreign Application Priority Data

Sep. 23, 2016    (KR) .................. 10-2016-0122352

(51) Int. Cl.
*G06F 3/041*    (2006.01)
*G06F 3/044*    (2006.01)
(Continued)

(52) U.S. Cl.
CPC ............ *G06F 3/0416* (2013.01); *G06F 3/041* (2013.01); *G06F 3/044* (2013.01); *G06F 3/0412* (2013.01);
(Continued)

(58) Field of Classification Search
CPC ...... G06F 3/0416; G06F 3/0412; G06F 3/044; G06F 2203/04111; G06F 2203/04112; H01L 51/5237
See application file for complete search history.

(56) References Cited

U.S. PATENT DOCUMENTS 8,970,520 B2    3/2015    Teraguchi et al.
9,947,727 B2 *   4/2018    Lee ....................... H01L 27/323
(Continued)

FOREIGN PATENT DOCUMENTS

EP         3026710 A1      6/2016
JP      P2010-181747 A     8/2010
(Continued)

OTHER PUBLICATIONS

Taiwan First Office Action, Taiwan Application No. 105143710, dated Nov. 21, 2017, 23 pages.
(Continued)

*Primary Examiner* — Ricardo Osorio
(74) *Attorney, Agent, or Firm* — Fenwick & West LLP

(57) ABSTRACT

An organic light-emitting display panel having a built-in touchscreen and an organic light-emitting display device having a built-in touchscreen is disclosed. The organic light-emitting display panel includes a plurality of subpixels defined therein by a plurality of data lines and a plurality of gate lines, an encapsulation layer having an encapsulating function, and a color filter layer located on the encapsulation layer. The organic light-emitting display device includes the organic light-emitting display panel. Both the organic light-emitting display panel having a built-in touchscreen and the organic light-emitting display device having a built-in touchscreen is provided with a structure enabling a touchscreen disposed therewithin.

22 Claims, 26 Drawing Sheets

(51) Int. Cl.
*H01L 27/32* (2006.01)
*H01L 51/52* (2006.01)

(52) U.S. Cl.
CPC ........ *H01L 27/323* (2013.01); *H01L 51/5234* (2013.01); *H01L 51/5237* (2013.01); *H01L 51/5284* (2013.01); *G06F 2203/04111* (2013.01); *G06F 2203/04112* (2013.01); *H01L 27/322* (2013.01); *H01L 51/5253* (2013.01)

(56) References Cited

U.S. PATENT DOCUMENTS

| | | | |
|---|---|---|---|
| 10,061,432 B2* | 8/2018 | Ahn | G06F 3/0412 |
| 2010/0110041 A1 | 5/2010 | Jang | |
| 2010/0134426 A1 | 6/2010 | Lee et al. | |
| 2012/0249454 A1 | 10/2012 | Teraguchi et al. | |
| 2014/0049522 A1* | 2/2014 | Mathew | H05B 33/0896 345/204 |
| 2014/0183478 A1 | 7/2014 | Lee et al. | |
| 2015/0009175 A1* | 1/2015 | Berget | G06F 3/044 345/174 |
| 2015/0036204 A1* | 2/2015 | Branda | G02B 5/23 359/244 |
| 2015/0060817 A1 | 5/2015 | Sato et al. | |
| 2015/0227254 A1* | 8/2015 | Kim | G06F 3/0416 345/174 |
| 2016/0239133 A1 | 8/2016 | Ko et al. | |
| 2016/0260780 A1* | 9/2016 | Kim | H01L 27/323 |
| 2016/0378224 A1* | 12/2016 | Kwon | H01L 51/5256 345/174 |
| 2017/0040490 A1* | 2/2017 | Lee | H01L 33/005 |
| 2017/0062537 A1* | 3/2017 | Kim | H01L 27/3248 |
| 2017/0090634 A1* | 3/2017 | Yang | G06F 3/0412 |
| 2017/0102797 A1* | 4/2017 | Cok | G06F 3/0412 |
| 2017/0131814 A1* | 5/2017 | Aridomi | B32B 27/00 |
| 2017/0271617 A1* | 9/2017 | Choi | H01L 27/3244 |
| 2017/0278901 A1* | 9/2017 | Kim | H01L 51/0097 |
| 2017/0288007 A1* | 10/2017 | Shin | H01L 51/56 |
| 2017/0308199 A1* | 10/2017 | Liu | G06F 3/044 |
| 2017/0323779 A1* | 11/2017 | Um | G02F 1/133711 |
| 2018/0011598 A1* | 1/2018 | Ku | G06F 3/0418 |
| 2018/0026225 A1* | 1/2018 | Kwon | H01L 51/5237 257/40 |
| 2018/0053905 A1* | 2/2018 | Lee | H01L 27/3262 |

FOREIGN PATENT DOCUMENTS

| | | |
|---|---|---|
| JP | P2010-277461 A | 12/2010 |
| JP | P2011-23558 A | 2/2011 |
| JP | 2012-212076 A | 11/2012 |
| JP | P2013-122752 A | 6/2013 |
| JP | P2014-211685 A | 11/2014 |
| JP | P2015-56522 A | 3/2015 |
| JP | 2015-072663 A | 4/2015 |
| JP | P2015-111318 A | 6/2015 |
| JP | P2015-143933 A | 8/2015 |
| JP | P2016-4280 A | 1/2016 |
| JP | P2016-38594 A | 3/2016 |
| JP | 2016-152047 A | 8/2016 |
| KR | 10-2016-0017336 A | 2/2016 |
| KR | 1020180006519 | 1/2018 |
| TW | M480722 U | 6/2014 |
| TW | M491878 U | 12/2014 |
| WO | WO 2013/018591 A1 | 2/2013 |
| WO | WO 2015/088629 A1 | 6/2015 |
| WO | WO 2016/031396 A1 | 3/2016 |

OTHER PUBLICATIONS

Japanese First Office Action, Japanese Application No. 2016-253761, dated Dec. 5, 2017, 10 pages. (with concise explanation of relevance).

European Extended Search Report, European Application No. 16207505.5. dated Jun. 30, 2017, 10 pages.

* cited by examiner

BULK TYPE

MESH TYPE

MESH TYPE

COE STRUCTURE

TOE STRUCTURE

M-TOE STRUCTURE

COE+M-TOE STRUCTURE

COE+M-TOE STRUCTURE

ORGANIC LIGHT-EMITTING DISPLAY PANEL AND ORGANIC LIGHT-EMITTING DISPLAY DEVICE HAVING BUILT-IN TOUCHSCREEN

CROSS REFERENCE TO RELATED APPLICATION

This application claims priority from Republic of Korea Patent Application No. 10-2016-0122352 filed on Sep. 23, 2016, which is hereby incorporated by reference for all purposes as if fully set forth herein.

BACKGROUND

Field

The present disclosure relates to an organic light-emitting display panel and an organic light-emitting display device having a built-in touchscreen.

Description of Related Art

In response to the development of the information society, demand for a variety of display devices for displaying images is increasing. In this regard, a range of display devices, such as liquid crystal display (LCD) devices, plasma display panels (PDPs), and organic light-emitting display devices, have recently come into widespread use.

Many display devices provide touch-based user interfaces enabling users to intuitively and conveniently input data or instructions directly to devices, rather than using conventional data input systems, such as buttons, a keyboard, or a mouse.

To provide such touch-based user interfaces, the ability to sense a touch made by a user and accurately detect touch coordinates is required.

In this regard, the related art enables touch sensing using a touch sensing method selected from among a variety of touch sensing methods, such as touch sensing using a resistive film, capacitive touch sensing, electromagnetic induction touch sensing, infrared (IR) touch sensing, and ultrasonic touch sensing.

In this regard, capacitance touch sensing is commonly used to sense a touch and touch coordinates using a plurality of touch electrodes disposed on a touch panel as touch sensors, based on a change in capacitance between touch electrodes or between a touch electrode and a pointer, such as a finger.

A range of attempts at disposing a touchscreen panel including electrodes in a display panel have been made in order to facilitate the fabrication of display devices and reduce the sizes of display devices.

Among a variety of display devices, organic light-emitting display devices can be fabricated to be relatively light and thin, since organic electroluminescent (EL) devices or organic light-emitting diodes (OLEDs) able to emit light themselves are used therein and a separate light source is not required.

In addition, organic light-emitting display devices are not only advantageous in terms of power consumption, since they are driven at low voltages, but also have desirable qualities, such as the ability to implement a range of colors of light, rapid response rates, wide viewing angles, and high contrast ratios. Thus, organic light-emitting display devices for next-generation displays have been actively researched.

Although organic light-emitting display devices are significantly advantageous in terms of display, there are significant difficulties and a range of limitations regarding touchscreen panels to be disposed within organic light-emitting display devices.

For example, an encapsulation layer or the like for protecting the organic light-emitting display panel from moisture, air, physical impacts, or impurities that would be created during fabrication processing must be provided on the front surface of the organic light-emitting display panel to make the organic light-emitting display panel reliable. However, this consequently causes processing to be relatively complicated and difficult. In addition, the encapsulation layer makes it difficult to determine the positions of touch sensors, with which touch sensing can be normally performed, without lowering display performance.

In addition, in fabrication processing of an organic light-emitting display panel, organic materials limit the degree of freedom of high temperature processing by which touch sensors formed of a metal material are manufactured within the organic light-emitting display panel.

Due to the limitations of organic light-emitting display panels regarding structural characteristics and processing, it is difficult to dispose touch electrodes acting as touch sensors within organic light-emitting display panels. That is, it is significantly difficult to realize organic light-emitting display panels having a built-in touchscreen panel.

Thus, in organic light-emitting display devices of the related art, a touch structure has been realized by attaching a touchscreen panel to an organic light-emitting display panel rather than disposing the touchscreen panel within the organic light-emitting display panel.

In such a case, the touchscreen panel must be fabricated separately from the organic light-emitting display panel before being attached to the organic light-emitting display panel, thereby leading to fabrication processing being relatively complicated and increasing the thickness of a resultant organic light-emitting display device, both of which are problematic.

BRIEF SUMMARY

Various aspects of the present disclosure provide an organic light-emitting display panel having a built-in touchscreen and an organic light-emitting display device having a built-in touchscreen, each of which has a structure enabling a touchscreen disposed therewithin.

Also provided are an organic light-emitting display panel having a built-in touchscreen and an organic light-emitting display device having a built-in touchscreen, each of which is able to improve touch sensing performance.

Also provided are an organic light-emitting display panel having a built-in touchscreen and an organic light-emitting display device having a built-in touchscreen, each of which has a structure enabling an ultrathin profile to be designed.

Also provided are an organic light-emitting display panel having a built-in touchscreen and an organic light-emitting display device having a built-in touchscreen, each of which has a touchscreen panel disposed therewithin without display performance being influenced.

Also provided are an organic light-emitting display panel having a built-in touchscreen and an organic light-emitting display device having a built-in touchscreen, each of which is configured such that two types of touch sensor metals (i.e. touch electrodes and touch lines) enabling self-capacitance based touch sensing are disposed in different layers.

According to an aspect of the present disclosure, provided is an organic light-emitting display panel having a built-in touchscreen.

The organic light-emitting display panel may include: a plurality of subpixels defined therein by a plurality of data lines and a plurality of gate lines; and a touch sensor (such as touch electrodes) built therein.

According to another aspect of the present disclosure, an organic light-emitting display device having a built-in touchscreen may include the organic light-emitting display panel having a built-in touchscreen.

The organic light-emitting display device may further include a touch sensing circuit supplying a touch driving signal to at least one touch electrode among the plurality of touch electrodes and sensing at least one of a touch and a touched position based on a signal detected using each of the plurality of touch electrodes to which the touch driving signal is applied.

The organic light-emitting display panel may further include an encapsulation layer and a color filter layer located on the encapsulation layer.

In the organic light-emitting display panel, the plurality of touch electrodes, corresponding to touch sensor metals, may be located on the encapsulation layer.

In the organic light-emitting display panel, a plurality of touch lines may be located on the encapsulation layer to electrically connect the plurality of touch electrodes to the touch sensing circuit, the plurality of touch lines acting as the touch sensor metals.

In the organic light-emitting display panel, the plurality of touch electrodes and the plurality of touch lines may be disposed in different layers between which an insulation layer is sandwiched.

Each of the plurality of touch lines is electrically connected to a corresponding touch electrode of the plurality of touch electrodes through a contact hole and is electrically isolated from the remaining touch electrodes.

In the organic light-emitting display panel, each of the plurality of touch lines may overlap at least one touch electrode of the plurality of touch electrodes.

In the organic light-emitting display panel, the plurality of touch electrodes may be disposed between the encapsulation layer and the color filter layer.

In this case, an overcoat layer may be disposed between the encapsulation layer and the color filter layer. The plurality of touch electrodes may be disposed between the encapsulation layer and the overcoat layer.

In the organic light-emitting display panel, the plurality of touch electrodes may be disposed on the color filter layer.

In this case, an overcoat layer may be disposed on the color filter layer. The plurality of touch electrodes may be disposed on the overcoat layer.

According to further another aspect of the present disclosure, an organic light-emitting display panel having a built-in touchscreen may include: a plurality of subpixels defined therein by a plurality of data lines and a plurality of gate lines; and a touch sensor built therein.

In the organic light-emitting display panel, each of the plurality of subpixels may include: an organic light-emitting diode including a first electrode, an organic light-emitting layer, and a second electrode; a driving transistor driving the organic light-emitting diode; a first transistor electrically connected between a first node of the driving transistor and a data line among the plurality of data lines corresponding thereto; and a storage capacitor electrically connected between the first node and a second node of the driving transistor.

The organic light-emitting display panel may further include: an encapsulation layer located on the second electrode of the organic light-emitting diode; and a color filter layer located on the encapsulation layer.

In the organic light-emitting display panel, a plurality of touch electrodes may be located on the encapsulation layer.

A touch driving signal may be supplied to at least one touch electrode among the plurality of touch electrodes. The touch electrode to which the touch driving signal is applied may form capacitance together with a pointer corresponding to a touch operation means of a user.

It is possible to sense either a touch or a touched position using capacitance that has been formed as described above.

According to the present disclosure as set forth above, the organic light-emitting display panel having a built-in touchscreen and the organic light-emitting display device having a built-in touchscreen are provided with a structure enabling a touchscreen panel to be disposed therewithin.

In addition, according to the present disclosure, the organic light-emitting display panel having a built-in touchscreen and the organic light-emitting display device having a built-in touchscreen can improve touch sensing performance.

Furthermore, according to the present disclosure, the organic light-emitting display panel having a built-in touchscreen and the organic light-emitting display device having a built-in touchscreen are provided with a structure enabling an ultrathin profile to be designed.

In addition, according to the present disclosure, the organic light-emitting display panel having a built-in touchscreen and the organic light-emitting display device having a built-in touchscreen are provided with a touchscreen panel disposed therewithin without display performance being influenced.

Furthermore, according to the present disclosure, the organic light-emitting display panel having a built-in touchscreen and the organic light-emitting display device having a built-in touchscreen are provided with a structure in which two types of touch sensor metals (i.e. touch electrodes and touch lines) enabling self-capacitance based touch sensing are disposed in different layers.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
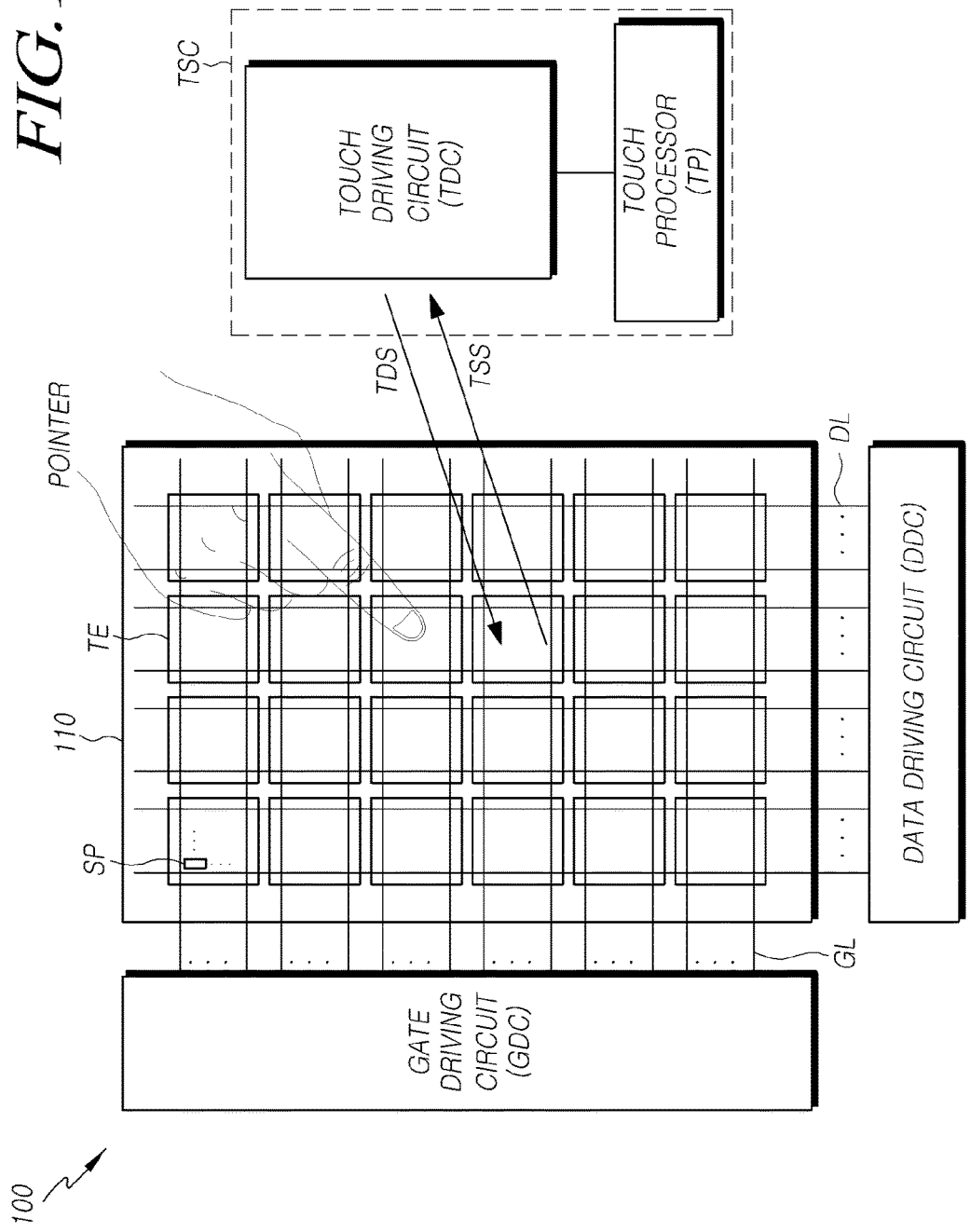
FIG. 1 is a schematic view illustrating the configuration of an organic light-emitting display device having a built-in touchscreen according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a schematic view illustrating the configuration of an organic light-emitting display device 100 having a built-in touchscreen according to exemplary embodiments.

Referring to FIG. 1, the organic light-emitting display device 100 having a built-in touchscreen according to exemplary embodiments can perform a display function to display images and a touch sensing function to sense a touch made using a pointer, such as a finger or a stylus.

The organic light-emitting display device 100 having a built-in touchscreen according to exemplary embodiments may operate in a display mode to perform the display function in a display mode section while operating in a touch mode to perform the touch sensing function in a touch mode section.

The display mode section and the touch mode section may be divided on a temporal basis, may be simultaneous within the same period of time, or may overlap on a temporal basis.

That is, the display mode operation for displaying images and the touch mode operation for performing touch sensing can be performed separately or simultaneously.

To perform the two functions (i.e. the display function and the touch sensing function), the organic light-emitting display device 100 having a built-in touchscreen according to exemplary embodiments includes an organic light-emitting display panel 110 having a built-in touchscreen, a display driving circuit, and a touch sensing circuit TSC. A plurality of subpixels SP defined by a plurality of data lines DL and a plurality of gate lines GL are arranged and a plurality of touch electrodes TE are disposed on the organic light-emitting display panel 110 having a built-in touchscreen. The display driving circuit drives the organic light-emitting display panel 110 having a built-in touchscreen to perform the display function. The touch sensing circuit TSC drives the organic light-emitting display panel 110 having a built-in touchscreen to perform the touch sensing function.

Referring to FIG. 1, the display driving circuit includes a data driving circuit DDC to drive the plurality of data lines DL and a gate driving circuit GDC to drive the plurality of gate lines GL in the display mode section.

The display driving circuit may further include at least one controller to control the operation timing of the data driving circuit DDC and the gate driving circuit GDC, the supply of power to the data driving circuit DDC and the gate driving circuit GDS, and the like.

Referring to FIG. 1, in the touch mode section, a touch sensing circuit TSC can supply a touch driving signal TDS to at least one touch electrode among the plurality of touch electrodes TE and determine the occurrence of a touch and/or a touched position based on a touch sensing signal TSS detected by the touch electrode TE to which the touch driving signal TDS is applied.

The touch sensing circuit TSC includes a touch driving circuit TDC, a touch processor TP, and the like. The touch driving circuit TDC drives the plurality of touch electrodes TE, while the touch processor TP determines the occurrence of a touch and/or a touched position based on signals received from the touch electrodes TE to which the touch driving signals TDS are applied.

The touch driving circuit TDC can supply the touch driving signals TDS to the plurality of touch electrodes TE to drive the plurality of touch electrodes TE.

In addition, the touch driving circuit TDC can receive touch sensing signals TSS from the touch electrodes TE to which the touch driving signals TDS are supplied.

The touch driving circuit TDC supplies the received touch sensing signals TSS, or sensing data obtained by processing the received touch sensing signals TSS, to the touch processor TP.

The touch processor TP can execute a touch algorithm using the touch sensing signals TSS or the sensing data and determine the occurrence of a touch and/or the touched position by executing the touch algorithm.

As described above, the organic light-emitting display device 100 having a built-in touchscreen according to exemplary embodiments uses a self-capacitance based touch sensing method that determines the occurrence of a touch and/or the touched position by detecting a change in self-capacitance between each of the touch electrodes TE and the pointer.

In the display device 100 having a built-in touchscreen according to exemplary embodiments, the touch driving signals TDS are applied to the touch electrodes TE and the touch sensing signals TSS are detected using the touch electrodes TE.

Since the organic light-emitting display device 100 having a built-in touchscreen according to exemplary embodiments senses a touch using the self-capacitance based touch sensing method as described above, the organic light-emitting display panel 110 having a built-in touchscreen is only required to have a self-capacitance based touch sensing structure.

Accordingly, it is not necessary to provide two types of touch sensor electrodes (i.e. driving electrodes and receiving electrodes) to the organic light-emitting display panel 110 having a built-in touchscreen, thereby simplifying and facilitating panel fabrication processing to form a touch sensing structure on the organic light-emitting display panel 110 having a built-in touchscreen.

The data driving circuit DDC, the gate driving circuit GDC, the touch driving circuit TDC, and the touch processor TP as described above are categorized according to function. The source driving circuit SDC, the gate driving circuit GDC, the touch driving circuit TDC, and the touch processor TP may be provided separately from each other, or alternatively, two or more thereof may be integrated with each other.

Figure 2:
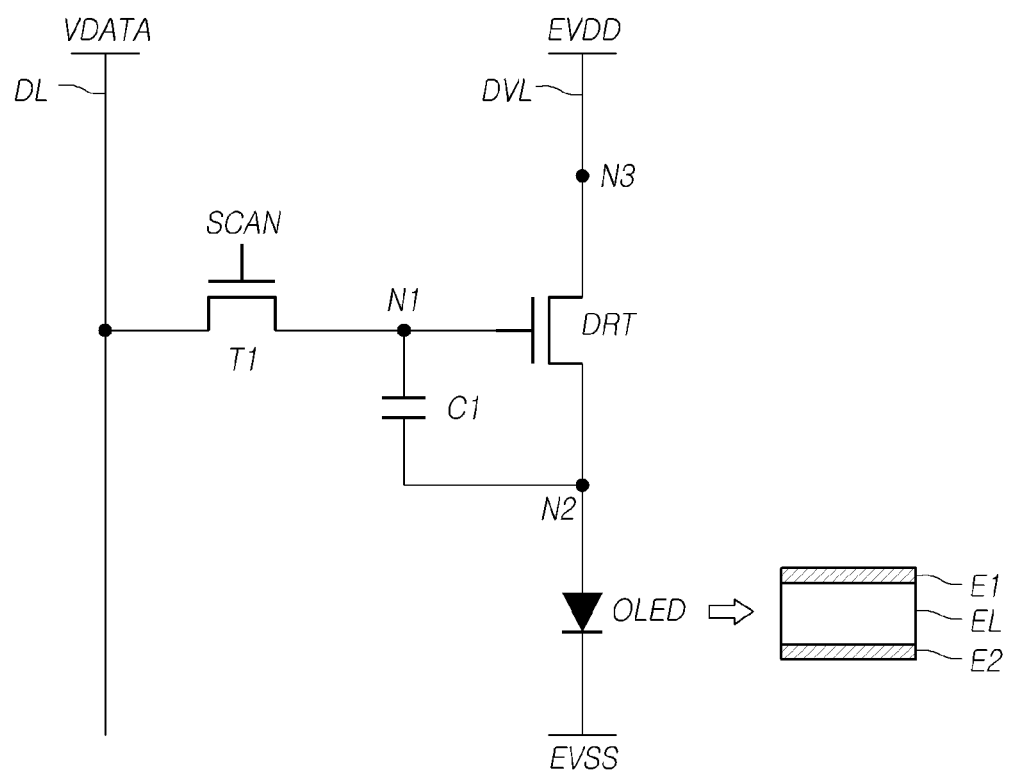
FIG. 2 is a schematic circuit diagram illustrating a subpixel structure of the organic light-emitting display panel having a built-in touchscreen according to exemplary embodiments.
Figure 3:
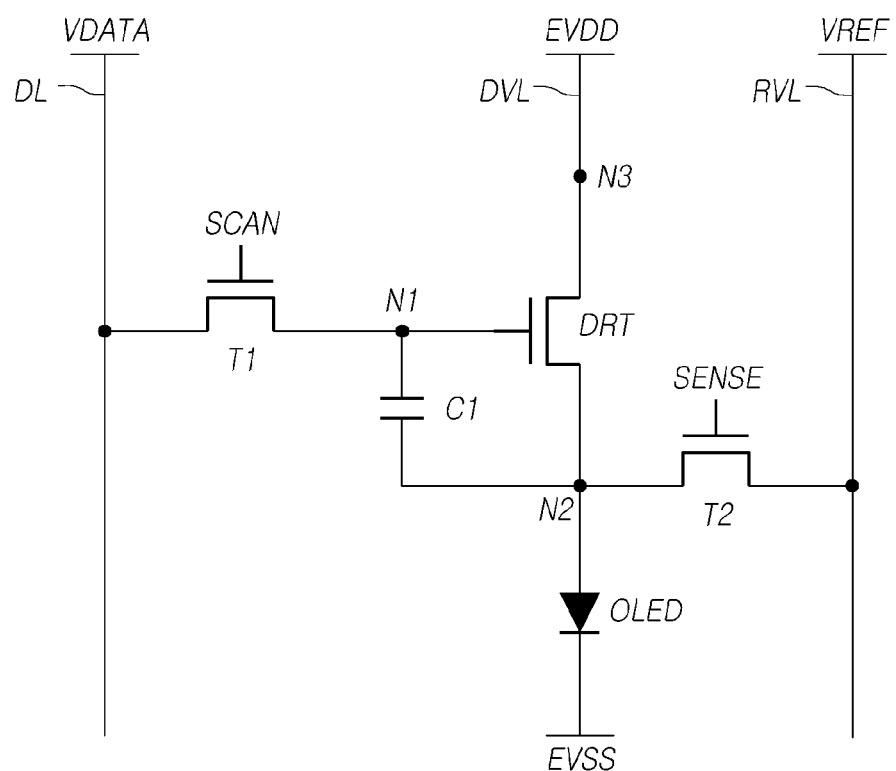
FIG. 3 is a schematic circuit diagram illustrating another subpixel structure of the organic light-emitting display panel having a built-in touchscreen according to exemplary embodiments.

FIG. 2 is a schematic circuit diagram illustrating a subpixel structure of the organic light-emitting display panel 110 having a built-in touchscreen according to exemplary embodiments, and FIG. 3 is a schematic circuit diagram illustrating another subpixel structure of the organic light-emitting display panel 110 having a built-in touchscreen according to exemplary embodiments.

Referring to FIG. 2, in the organic light-emitting display panel 110 having a built-in touchscreen according to exemplary embodiments, each of the subpixels SP basically includes an organic light-emitting diode OLED; a driving transistor DRT driving the OLED; a first transistor T1 delivering data to a first node N1 of the driving transistor DRT corresponding to a gate node; and a storage capacitor C1 maintaining a data voltage VDATA corresponding to an image signal voltage or a voltage corresponding to the data voltage for a period of a single frame.

The OLED includes a first electrode (i.e. an anode or a cathode) E1, an organic light-emitting layer EL, and a second electrode (i.e. a cathode or an anode) E2.

For example, a base voltage EVSS is applied to the second electrode E2 of the OLED.

The driving transistor DRT drives the OLED by supplying driving current to the OLED.

The driving transistor DRT has a first node N1, a second node N2, and a third node N3.

The first node N1 of the driving transistor DRT, corresponding to the gate node, is electrically connected to a source node or a drain node of the first transistor T1.

The second node N2 of the driving transistor DRT is electrically connected to the first electrode E1 of the OLED, and is a source node or a drain node.

The third node N3 of the driving transistor DRT is a node to which a driving voltage EVDD is applied, is electrically connected to a driving voltage line DVL through which the driving voltage EVDD is supplied, and is a drain node or a source node.

The driving transistor DRT and the first transistor T1 may be embodied as n-type transistors or p-type transistors.

The first transistor T1 is electrically connected between a data line DL and the first node N1 of the driving transistor DRT, and is controlled by a scanning signal SCAN applied to the gate node thereof through a gate line.

The first transistor T1 is turned on by the scanning signal SCAN to deliver the data voltage VDATA, supplied through the data line DL, to the first node of the driving transistor.

The storage capacitor C1 is electrically connected between the first node N1 and the second node N2 of the driving transistor DRT.

The storage capacitor C1 is an external capacitor intentionally designed to be disposed outside of the driving transistor DRT, instead of being a parasitic capacitor Cgs or Cgd, i.e. an internal capacitor present between the first node N1 and the second node N2 of the driving transistor DRT.

Referring to FIG. 3, each of the subpixels SP disposed on the organic light-emitting display panel according to exemplary embodiments further includes a second transistor T2, in addition to the OLED, the driving transistor DRT, the first transistor T1, and the storage capacitor C1.

Referring to FIG. 3, the second transistor T2 is electrically connected between the second node N2 of the driving transistor DRT and a reference voltage line RVL through which a reference voltage VREF is supplied, and is controlled by a sensing signal SENSE, a type of scanning signal, supplied to the gate node thereof.

Since the second transistor T2 is further provided, it is possible to more effectively control the status of the voltage of the second node N2 of the driving transistor DRT of the subpixel SP.

The second transistor T2 is turned on by the sensing signal SENSE to apply the reference voltage VREF, supplied through the reference voltage line RVL, to the second node N2 of the driving transistor DRT.

The subpixel structure illustrated in FIG. 3 is advantageous for accurately initializing the voltage of the second node N2 of the driving transistor DRT and sensing the unique characteristics (e.g. the threshold voltage or the degree of mobility) of the driving transistor DRT and the unique characteristics (e.g. the threshold voltage) of the OLED.

The scanning signal SCAN and the sensing signal SENSE may be separate gate signals. In this case, the scanning signal SCAN and the sensing signal SENSE may be applied to the gate node of the first transistor T1 and the gate node of the second transistor T2, respectively, through different gate lines.

Alternatively, the scanning signal SCAN and the sensing signal SENSE may be identical signals. In this case, the scanning signal SCAN and the sensing signal SENSE may be commonly applied to the gate node of the first transistor T1 and the gate node of the second transistor T2.

Hereinafter, a touchscreen building-in structure allowing a touchscreen to be built in an organic light-emitting display panel that can have the above-described subpixel structure, as well as an integrated driving method, an integrated driving circuit, and a signal connecting structure associated with the touchscreen building-in structure, will be described.

In the organic light-emitting display panel 110 having a built-in touchscreen, when the subpixel structure includes the first electrode E1, the organic light-emitting layer EL disposed on the first electrode E1, and the second electrode E2 disposed on the organic light-emitting layer EL, an encapsulation layer may be disposed on the second electrode E2 to prevent moisture, air, or the like from infiltrating thereinto.

Figure 4:
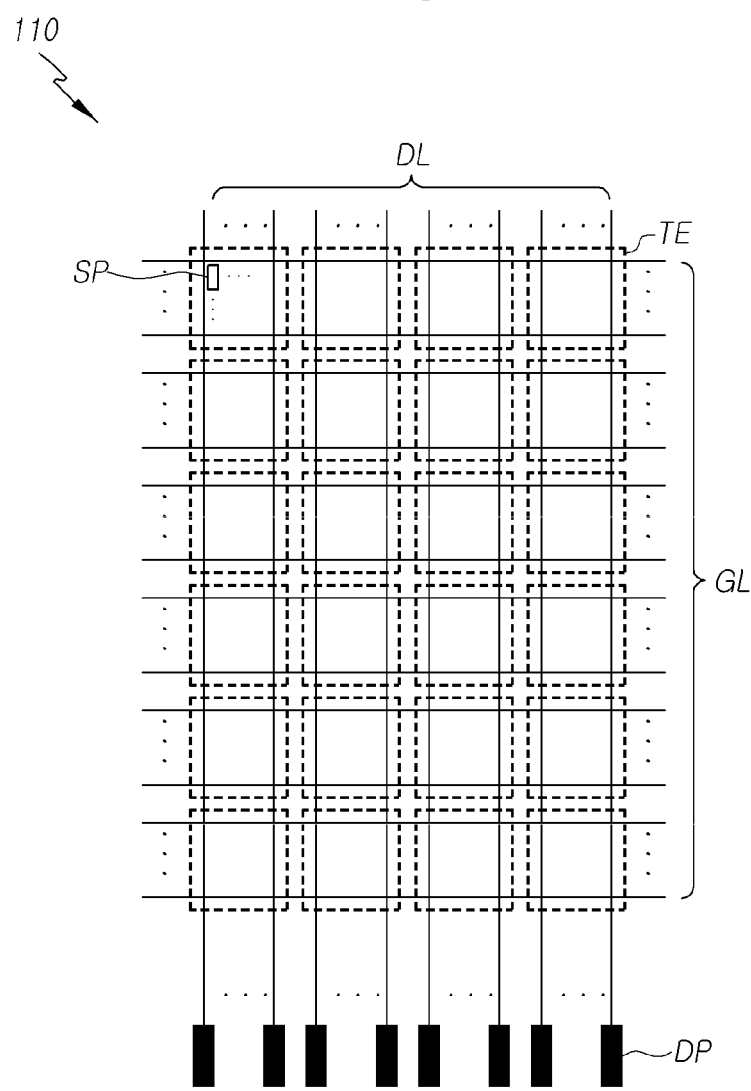
FIG. 4 is a schematic view illustrating display driving patterns in the organic light-emitting display panel having a built-in touchscreen according to exemplary embodiments.

FIG. 4 is a schematic view illustrating display driving patterns in the organic light-emitting display panel 110 having a built-in touchscreen according to exemplary embodiments.

Referring to FIG. 4, each of the subpixels SP may have the subpixel structure illustrated in FIG. 2 or FIG. 3, and in a display mode section, may be driven by a single data line DL and one or more gate lines GL.

Data pads DP are connected to ends of the data lines DL to electrically connect the data lines DL to the data driving circuit DDC.

Referring to FIG. 4, although the size of a single touch electrode TE may be the same as the size of a single subpixel SP, the size of the single touch electrode TE may be greater than the size of a single subpixel SP in regard of the degrees of efficiency of touch driving and touch sensing.

Figure 5:
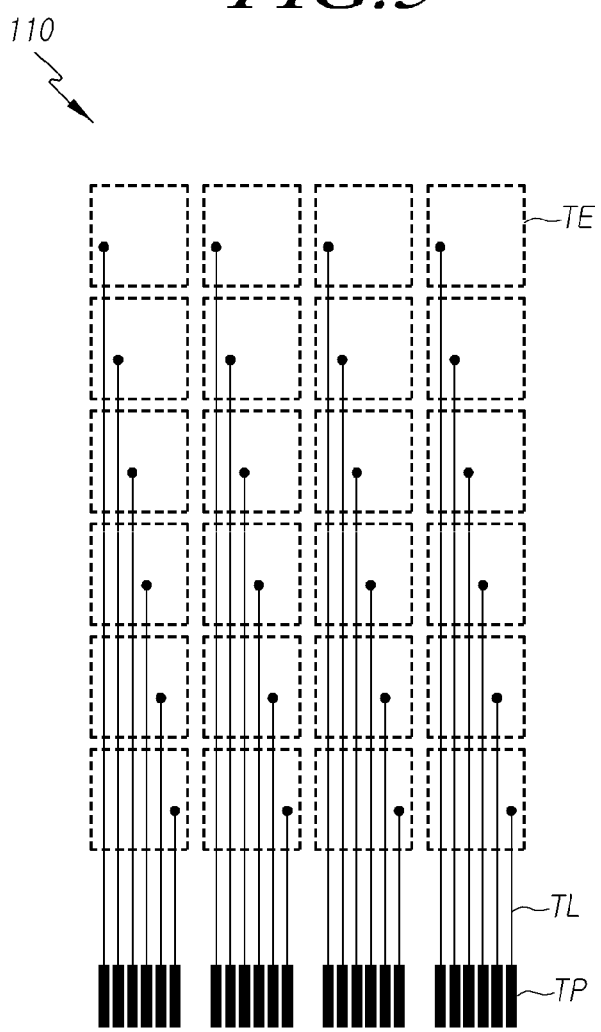
FIG. 5 is a schematic view illustrating touch sensing patterns in the organic light-emitting display panel having a built-in touchscreen according to exemplary embodiments.

FIG. 5 is a schematic view illustrating touch sensing patterns in the organic light-emitting display panel 110 having a built-in touchscreen according to exemplary embodiments.

Referring to FIG. 5, touch sensing patterns (or touch sensor metals), including a plurality of touch electrodes TE, a plurality of touch lines TL, and a plurality of touch pads TP, are disposed on the organic light-emitting display panel 110 having a built-in touchscreen according to exemplary embodiments.

Since the plurality of touch electrodes TE are touch sensors for self-capacitance based touch sensing, each of the touch electrodes TE acts as both a driving electrode and a receiving electrode (i.e. a sensing electrode).

In this regard, the plurality of touch electrodes TE are respectively electrically isolated from each other.

In addition, the plurality of touch electrodes TE do not overlap each other.

The plurality of touch lines TL are signal lines electrically connecting the plurality of touch electrodes TE to the touch sensing circuit TSC.

The plurality of touch pads TP are disposed on predetermined ends of the plurality of touch lines TL and are electrically connected to the touch sensing circuit TSC.

Figure 6:
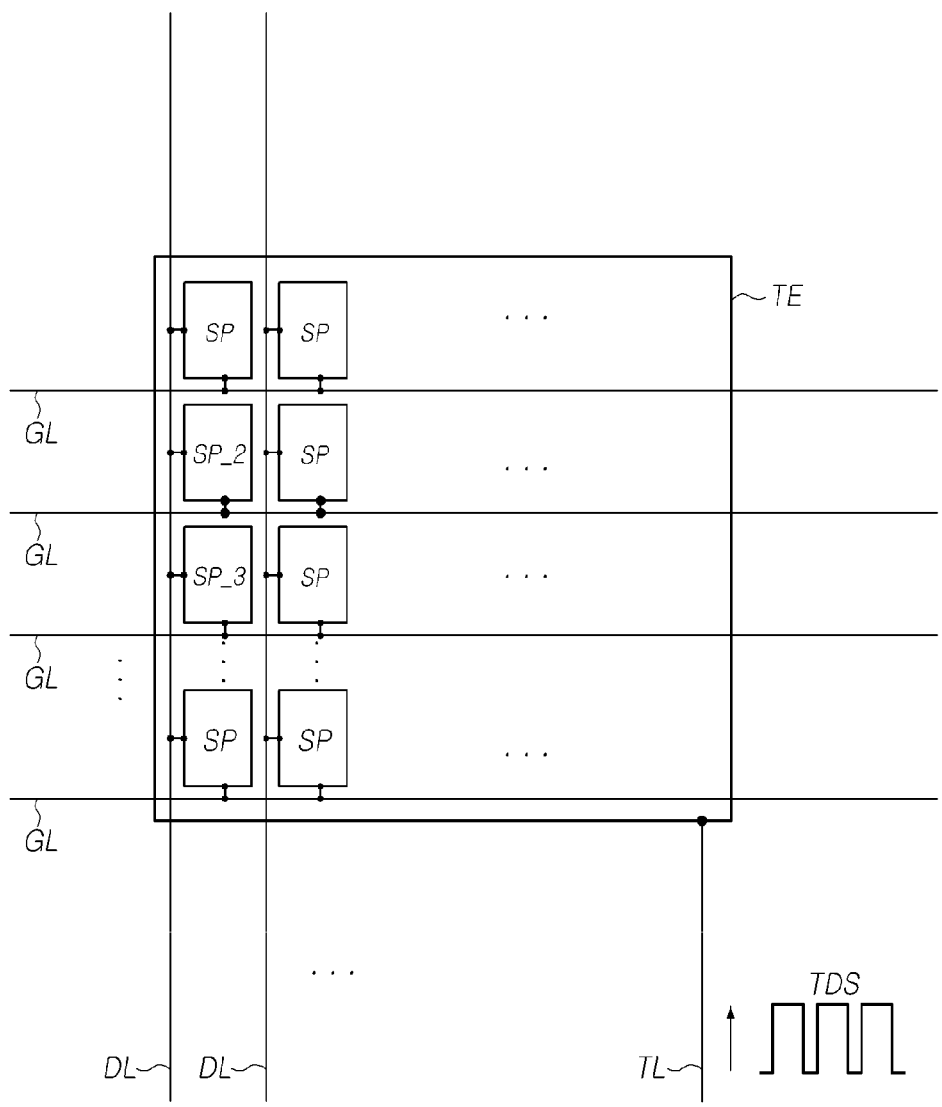
FIG. 6 is a schematic view illustrating a single touch electrode in the organic light-emitting display panel having a built-in touchscreen according to exemplary embodiments.

FIG. 6 is a schematic view illustrating a single touch electrode among the plurality of touch electrodes TE in the organic light-emitting display panel 110 having a built-in touchscreen according to exemplary embodiments.

Referring to FIG. 6, the single touch electrode TE has a touch driving signal TDS supplied through a single touch line TL.

A single subpixel SP operates using a data voltage VDATA supplied through a single data line DL, as well as scanning signals supplied through one or more gate lines GL depending on the structure of the subpixel.

As illustrated in FIG. 6, the size of each of the plurality of touch electrodes TE is greater than the size of each of the plurality of subpixels SP.

For example, the size of a single touch electrode TE may be greater than the size of two subpixels SP.

Since the size of a single touch electrode TE is greater than the size of two subpixels SP as described above, two or more gate lines GL or two or more data lines DL may be disposed in an area occupied by each of the touch electrodes TE.

Since the size of a single touch electrode TE is greater than the size of two subpixels SP in the organic light-emitting display panel 110 having a built-in touchscreen as described above, the plurality of the touch electrodes may be reduced. Accordingly, the number of instances of touch driving in which touch driving signals TDS are supplied to the touch electrodes TE may be reduced or sensing data may be reduced, whereby the efficiency of touch sensing may be improved.

However, when the plurality of the touch electrodes is reduced due to the increased size of the touch electrodes, the efficiency of touch sensing may be improved due to reduced sensing data, but the accuracy of touch sensing may be reduced.

Thus, the number and size of the touch electrodes must be accurately set in consideration of the efficiency and accuracy of touch sensing.

In the touch mode section, touch driving signals TDS supplied to one or more touch electrodes among the touch electrodes TE or the entirety of the touch electrodes TE may be pulse-type signals.

The touch driving signals TDS may be pulse-type signals having a waveform, for example, a spherical wave, a sine wave, or a triangular wave.

The touch driving signals TDS may have a predetermined wavelength, phase, amplitude, or the like.

Figure 7:
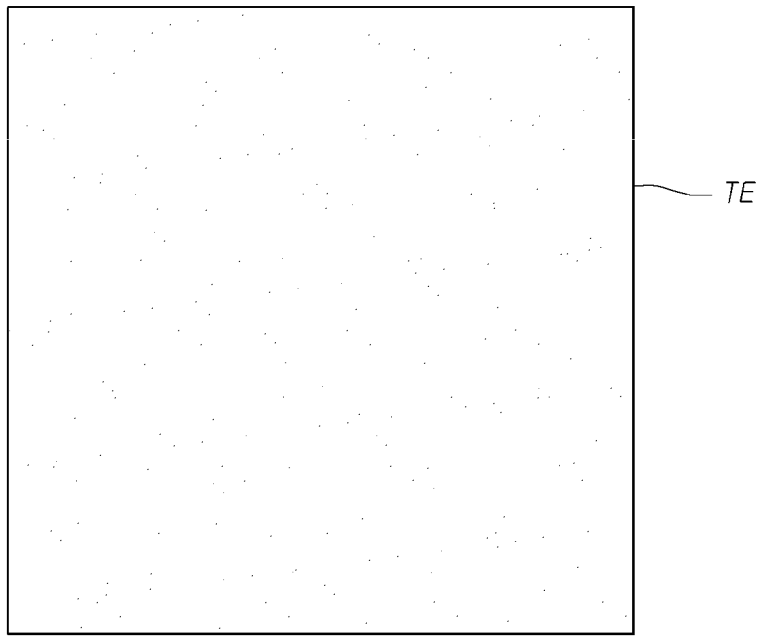
FIG. 7 is a schematic view illustrating a bulk-type touch electrode in the organic light-emitting display panel having a built-in touchscreen according to exemplary embodiments.

FIG. 7 is a schematic view illustrating a bulk-type touch electrode TE in the organic light-emitting display panel 110 having a built-in touchscreen according to exemplary embodiments.

Figure 8:
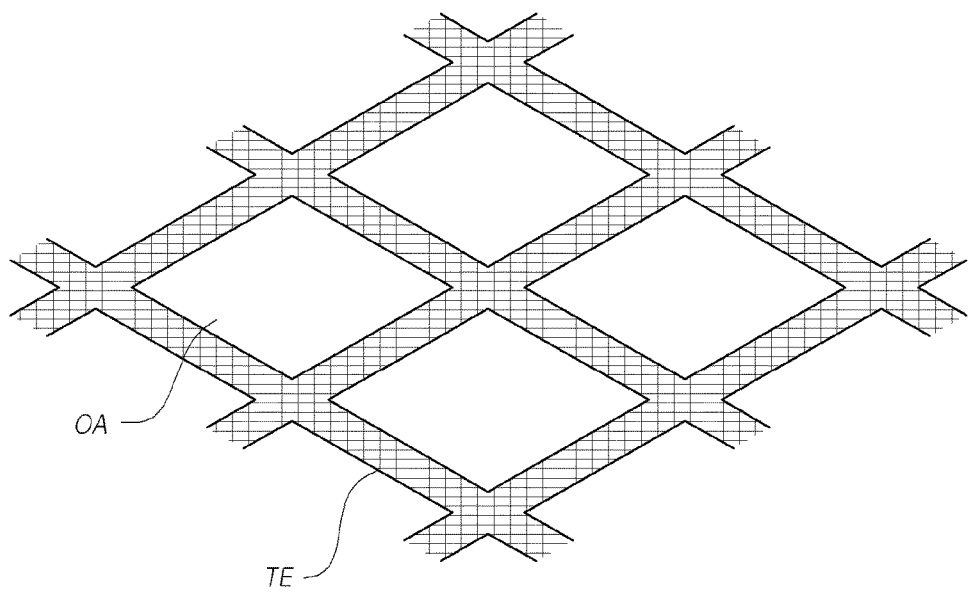
FIG. 8 and FIG. 9 are schematic views illustrating a mesh-type touch electrode in the organic light-emitting display panel having a built-in touchscreen according to exemplary embodiments.

Referring to FIG. 7, each of the plurality of touch electrodes TE may be a bulk-type touch electrode without an open area (OA in FIG. 8).

When the touch electrodes TE are bulk-type touch electrodes, the touch electrodes TE may be transparent electrodes.

When the touch electrodes TE are formed as bulk-type electrodes without an open area OA as described above, the touch electrodes TE can be easily patterned.

In addition, when the touch electrodes TE are embodied as transparent electrodes, the touch electrodes TE without an influence on luminescent performance in subpixel areas can be formed on the organic light-emitting display panel 110 having a built-in touchscreen.

Figure 9:
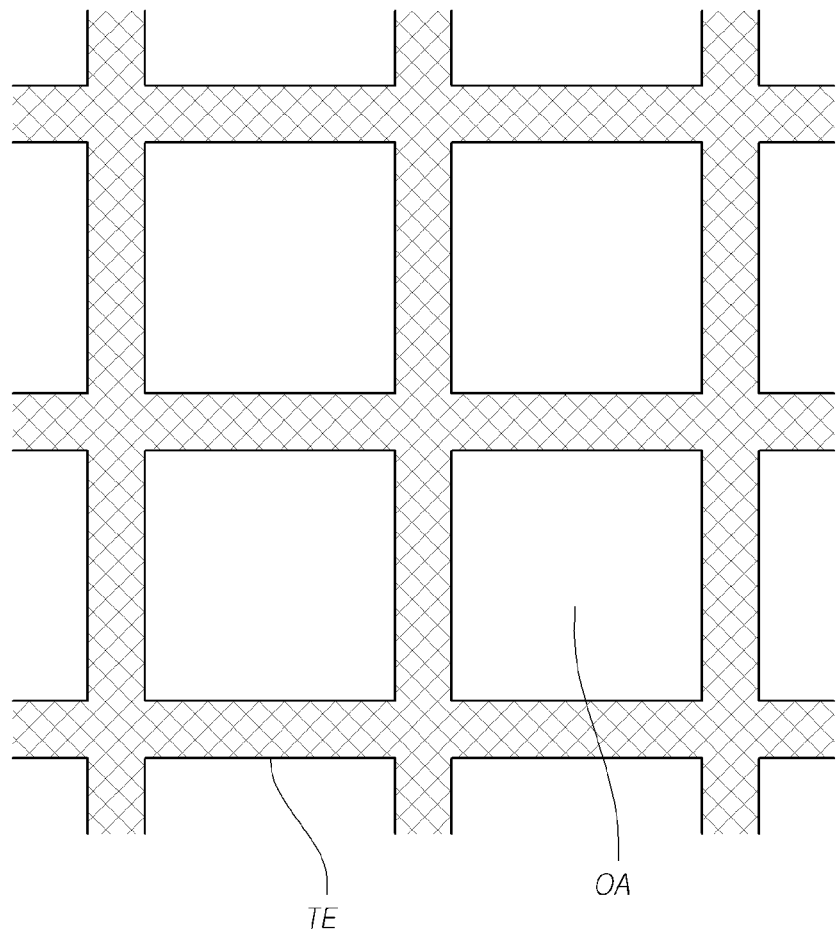

FIG. 8 and FIG. 9 are schematic views illustrating a mesh-type touch electrode TE in the organic light-emitting display panel 110 having a built-in touchscreen according to exemplary embodiments.

As illustrated in FIG. 8 and FIG. 9, each of the plurality of touch electrodes TE may be a mesh-type touch electrode having open areas OA.

When the touch electrodes TE are mesh-type touch electrodes, the touch electrodes TE may be transparent or opaque electrodes.

When the touch electrodes TE are embodied as mesh-type touch electrodes, each of the open areas OA corresponds to a light-emitting area of each subpixel. That is, the first electrode E1 of each subpixel is located in each open area OA.

As illustrated in FIG. 8, the mesh-type touch electrodes TE or the open areas OA thereof may be diamond shaped, depending on the shape of the arrangement of the subpixels.

Alternatively, as illustrated in FIG. 9, the mesh-type touch electrodes TE or the open areas OA thereof may be rectangular, depending on the shape of the arrangement of the subpixels.

The mesh-type touch electrodes TE or the open areas OA thereof may have a variety of shapes depending on the shape of the subpixels, rather than being diamond shaped or rectangular.

As described above, the touch electrodes TE that are suitable for the structure and shape of the subpixels without reducing the luminescent efficiency of the subpixels can be formed on the organic light-emitting display panel 110 having a built-in touchscreen.

Figure 10:
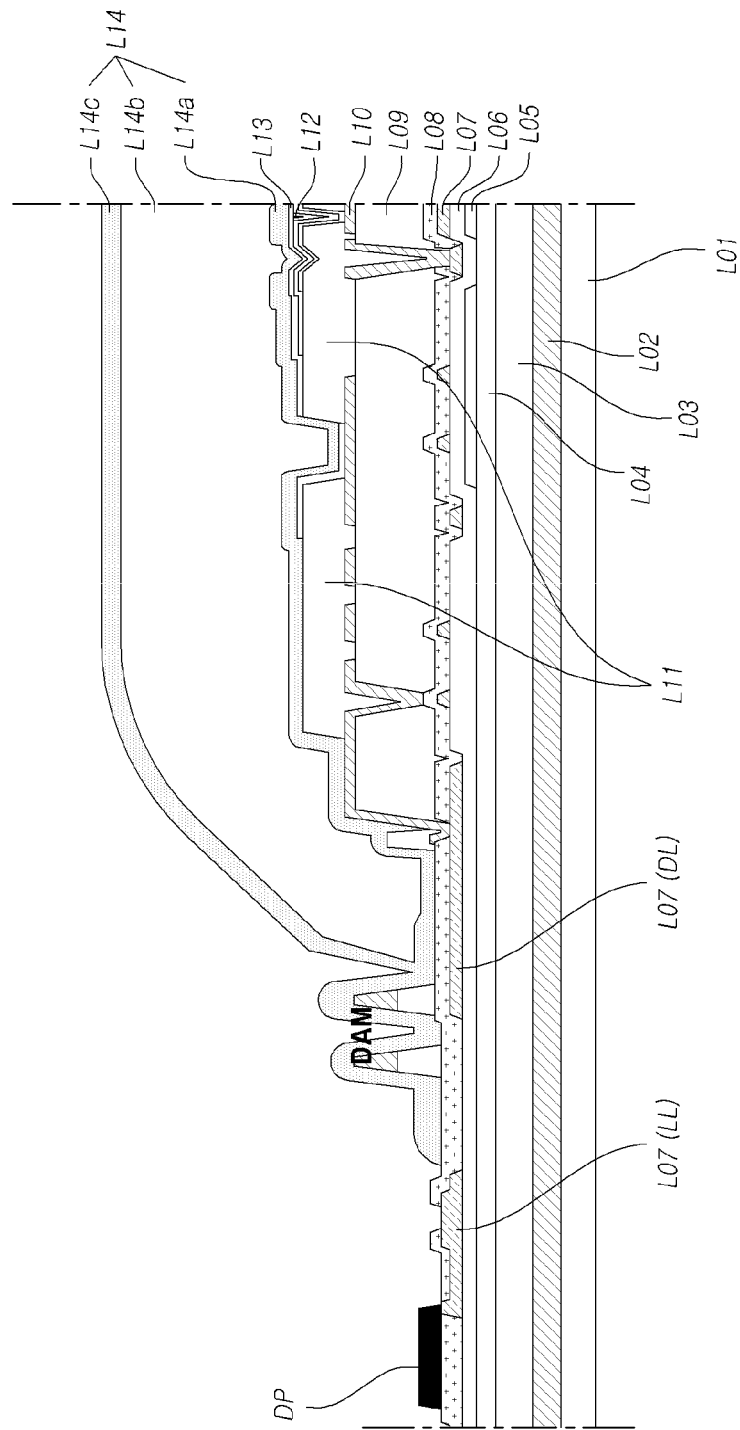
FIG. 10 is a cross-sectional view illustrating the organic light-emitting display panel having a built-in touchscreen according to exemplary embodiments.

FIG. 10 is a cross-sectional view illustrating the organic light-emitting display panel 110 having a built-in touchscreen according to exemplary embodiments.

The cross-sectional structure of the organic light-emitting display panel 110 having a built-in touchscreen will be described with reference to FIG. 10.

A polyimide (PI) layer L02 is located on a substrate or a back plate L01.

A buffer layer L03 is located on the polyimide layer L02, and an interlayer insulating film L04 is located on the buffer layer L03.

A gate layer L05 is located on the interlayer insulating film L04, and gate electrodes or the like may be formed in desired positions on the gate layer L05.

A gate insulating film L06 is located on the gate layer L05.

A source/drain layer L07 is located on the gate insulating film L06.

Signal lines, such as data lines DL and link lines GL, and the source/drain electrodes of a variety of transistors may be formed on the source/drain layer L07.

A protective layer L08 is located on the source/drain layer L07.

A planarization layer L09 is located on the protective layer L08, and a first electrode layer L10 is located on the planarization layer L09. The first electrode layer L10 has first electrodes E1 formed in light-emitting positions of subpixels.

A bank layer L11 is located on the first electrode layer L10, and an organic light-emitting layer L12 is located on the bank layer L11.

A second electrode layer L13 is located on the organic light-emitting layer L12. The second electrode layer L13 is formed commonly in the entirety of subpixel areas.

An encapsulation layer L14 for preventing the infiltration of moisture, air, and the like is located on the second electrode layer L13.

A dam stacked to be higher than surrounding portions to prevent the encapsulation layer L14 from collapsing may be provided on the peripheral portions of the panel.

The encapsulation layer L14 may be a single layer or may be comprised of two or more layers stacked on each other.

In addition, the encapsulation layer L14 may be a metal layer or may have a multilayer structure in which two or more layers comprised of organic and inorganic layers are stacked on each other.

In the implementation illustrated in FIG. 10, the encapsulation layer L14 is a multilayer structure comprised of a first encapsulation layer L14a, a second encapsulation layer L14b, and a third encapsulation layer L14c.

Each of the first encapsulation layer L14a, the second encapsulation layer L14b, and the third encapsulation layer L14c may be an organic layer and/or an inorganic layer.

Referring to FIG. 10, the thickness of the encapsulation layer L14 may be determined in consideration of encapsulation performance.

The thickness of the encapsulation layer L14 may have an effect on resistor-capacitor (RC) delay and touch sensing performance (touch sensitivity) with regard to touch driving and touch sensing.

Thus, the thickness of the encapsulation layer L14 must be determined in consideration of RC delay and touch sensing performance (touch sensitivity).

This feature will be described in greater detail with reference to FIG. 22 to FIG. 25.

In addition, the organic light-emitting display panel 110 having a built-in touchscreen according to exemplary embodiments has a color filter-on-encapsulation layer (COE) structure in which a color filter layer is located on the encapsulation layer L14 and a touch sensor-on-encapsulation layer (TOE) structure in which touch sensor metals, such as touch electrodes TE and touch lines TL, are located on the encapsulation layer L14.

Hereinafter, the COE structure and the TOE structure will be described in greater detail.

Figure 11:
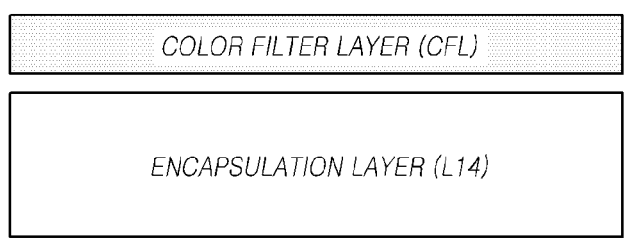
FIG. 11 is a schematic view illustrating a color filter-on-encapsulation layer (COE) structure of the organic light-emitting display panel having a built-in touchscreen according to exemplary embodiments.

FIG. 11 is a schematic view illustrating a COE structure of the organic light-emitting display panel 110 having a built-in touchscreen according to exemplary embodiments.

Referring to FIG. 11, the organic light-emitting display panel 110 having a built-in touchscreen has an encapsulation layer L14 to prevent the organic materials of OLEDs from being exposed to oxygen, moisture, or the like.

The encapsulation layer L14 may be located on second electrodes E2 of the OLEDs commonly disposed in the area in which the entirety of subpixels SP are arranged.

The organic light-emitting display panel 110 having a built-in touchscreen further includes a color filter layer CFL located to correspond to the first electrode E1 of the OLED. The color filter layer CFL converts white light generated by the organic light-emitting layer EL into light having a different color.

In the color filter layer CFL, for example, a red color filter, a green color filter, and a blue color filter may be formed.

Referring to FIG. 11, in the organic light-emitting display panel 110 having a built-in touchscreen, the color filter layer CFL is located on the encapsulation layer L14.

This structure is referred to as the COE structure.

Figure 12:
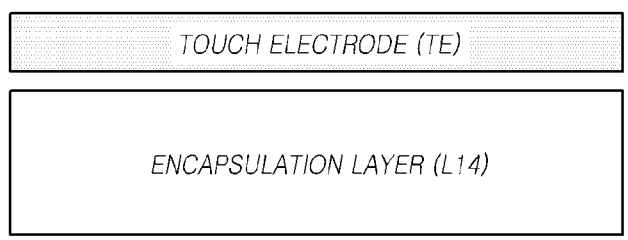
FIG. 12 is a schematic view illustrating a touch sensor-on-encapsulation layer (TOE) structure of the organic light-emitting display panel having a built-in touchscreen according to exemplary embodiments.

FIG. 12 is a schematic view illustrating a TOE structure of the organic light-emitting display panel 110 having a built-in touchscreen according to exemplary embodiments.

As described above, in the touch mode section, a touch driving signal TDS is supplied to at least one touch electrode TE among the plurality of touch electrodes TE corresponding to touch sensors disposed in the organic light-emitting display panel 110 having a built-in touchscreen according to exemplary embodiments. The touch electrode TE to which the touch driving signal TDS is applied can form capacitance (self-capacitance) together with a pointer corresponding to a touch operation means of a user.

Referring to FIG. 12, the plurality of touch electrodes TE of the touch sensor metals are located on the encapsulation layer L14.

This structure is referred to as the TOE structure.

Since the organic light-emitting display panel 110 having a built-in touchscreen is designed to have the COE structure as described above, it is possible to improve luminescent efficiency, and in some cases, omit a circular polarizer. In addition, the use of the TOE structure can realize the organic light-emitting display panel 110 having a built-in touchscreen able to provide a touch sensing function without a problem in a display function. In addition, the touchscreen can be built in the organic light-emitting display panel 110 without making panel fabrication processing complicated.

In addition, the touch sensor metals further include the plurality of touch lines TL through which the plurality of touch electrodes TE are electrically connected to the touch sensing circuit TSC, in addition to the plurality of touch electrodes TE.

The plurality of touch lines TL are also located on the encapsulation layer L14.

Since the touch lines TL, through which the plurality of touch electrodes TE are electrically connected to the touch sensing circuit TSC, are disposed on the encapsulation layer L14 as described above, signal transmission for touch driving and touch sensing can be efficiently performed.

Figure 13:
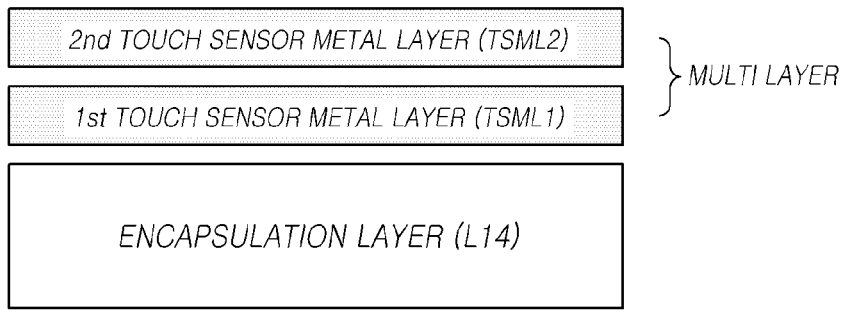
FIG. 13 is a schematic view illustrating a M-TOE structure of the organic light-emitting display panel having a built-in touchscreen according to exemplary embodiments.

FIG. 13 is a schematic view illustrating a multiple touch sensor metal layer-on-encapsulation layer (M-TOE) structure of the organic light-emitting display panel 110 having a built-in touchscreen according to exemplary embodiments.

Referring to FIG. 13, touch sensor metals include a number of touch electrodes TE, a plurality of touch lines TL, and the like.

The number of touch electrodes TE and the plurality of touch lines TL may be disposed in different layers.

The plurality of touch lines TL are disposed in a first touch sensor metal layer (TSML1), while the number of touch electrodes TE are disposed in a second touch sensor metal layer (TSML2).

Alternatively, the plurality of touch lines TL may be disposed in the second touch sensor metal layer (TSML2), while the number of touch electrodes TE may be disposed in the first touch sensor metal layer (TSML1).

The plurality of touch lines TL are electrically connected to the number of touch electrodes TE such that there is one-to-one correspondence between the touch lines TL and the touch electrodes TE.

Thus, each of the touch lines TL is electrically connected to a respective touch electrode TE corresponding thereto through a contact hole extending through an insulation layer, but is electrically isolated from the other touch electrodes through the insulation layer.

The TOE structure in which the number of touch electrodes TE and the plurality of touch lines TL are disposed in different touch sensor metal layers TSML1 and TSML2 on the same encapsulation layer L14 is referred to as the M-TOE structure.

Since the organic light-emitting display panel 110 having a built-in touchscreen is designed to have the M-TOE structure as described above, the touch electrodes TE and the touch lines TL that must be electrically isolated from each other can be accurately disconnected.

Figure 14:
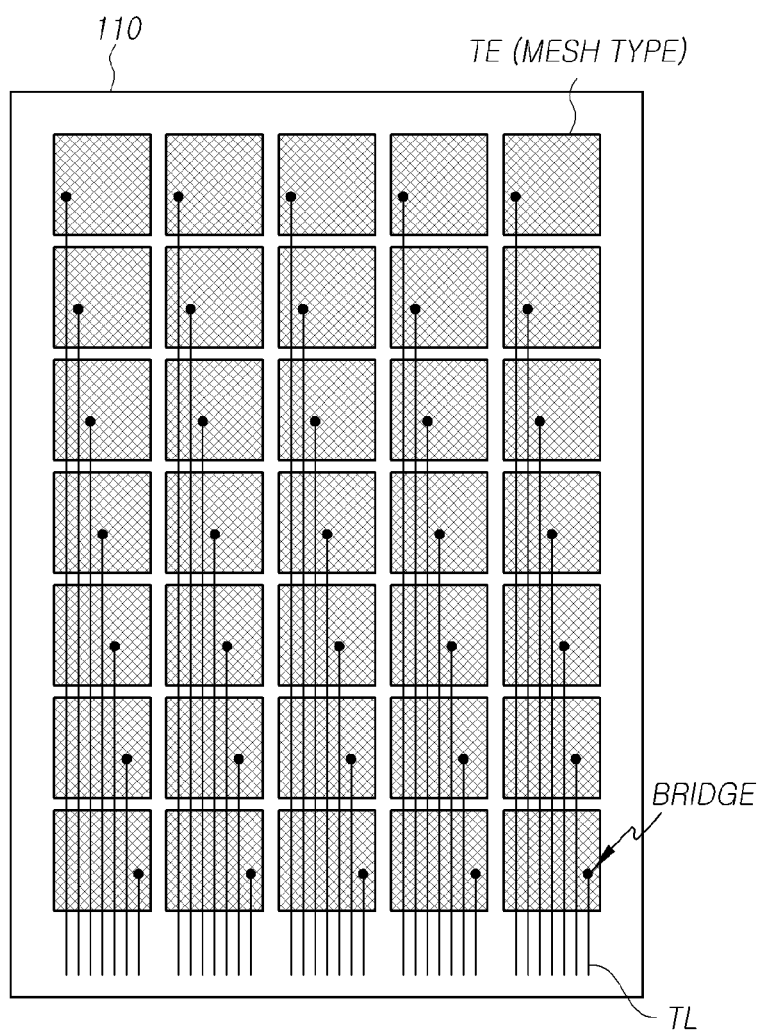
FIG. 14 and FIG. 15 are plan views illustrating organic light-emitting display panels having a built-in touchscreen and a M-TOE structure according to exemplary embodiments.
Figure 15:
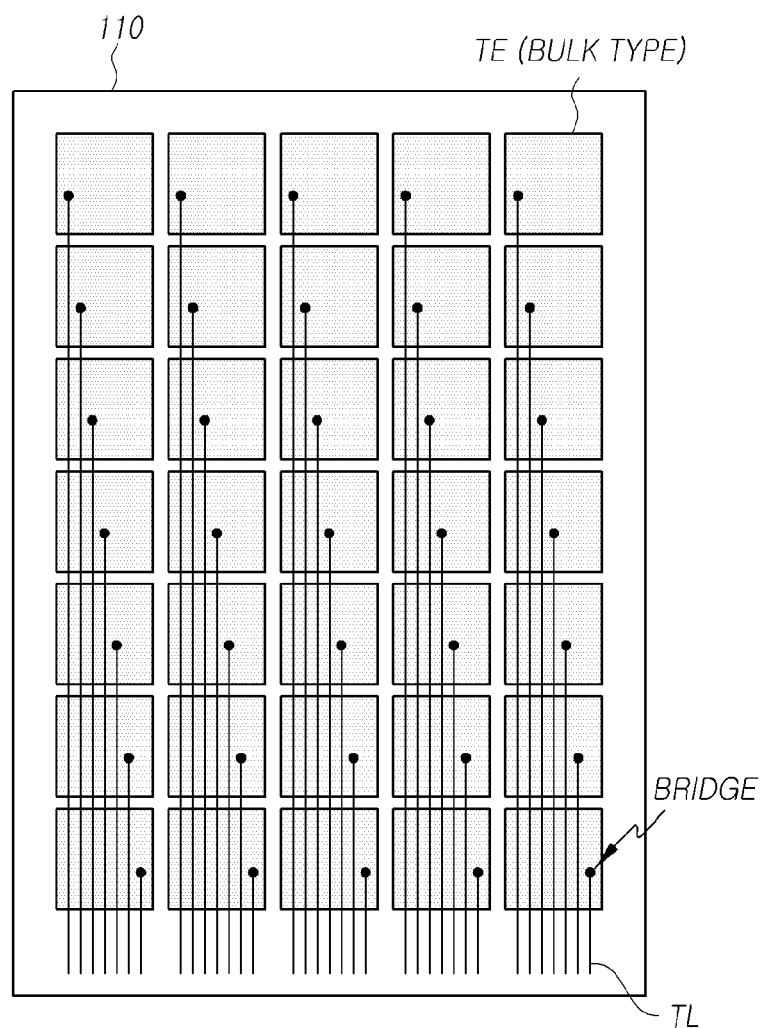

FIG. 14 and FIG. 15 are plan views illustrating the organic light-emitting display panels 110 having a built-in touchscreen according to exemplary embodiments in which the M-TOE structure is used.

FIG. 14 illustrates a case in which the touch electrodes TE are mesh-type touch electrodes having open areas.

Two or more subpixels SP may be disposed below each of the touch electrodes TE.

Thus, each of the touch electrodes TE must not block light emitted from two or more underlying subpixels SP.

When the touch electrodes TE are mesh-type touch electrodes having open areas, each of the open areas corresponds to each light-emitting area of the subpixels SP.

When the touch electrodes TE are mesh-type touch electrodes having open areas, the touch electrodes TE may be transparent electrodes or opaque electrodes.

FIG. 15 illustrates a case in which the touch electrodes TE are bulk-type touch electrodes without open areas.

Two or more subpixels SP may be disposed below each touch electrode TE.

Thus, the touch electrode TE must not block light emitted from the two or more underlying subpixels SP.

In this regard, when the touch electrodes TE are bulk-type touch electrodes without open areas, the touch electrodes TE may be transparent electrodes.

Referring to FIG. 14 and FIG. 15, each of the plurality of touch lines TL is electrically connected to one touch electrode TE among the number of touch electrodes TE.

Each of the plurality of touch lines TL must be electrically connected to a specific touch electrode and must not be electrically connected to the other touch electrodes.

In addition, as illustrated in FIG. 14 and FIG. 15, the first touch sensor metal layer TSML1, in which the plurality of touch lines TL are disposed, overlap the second touch sensor metal layer TSML2, in which the plurality of touch electrodes TE are disposed. Each of the plurality of touch lines TL overlaps at least one touch electrode among the plurality of touch electrodes TE.

The different types of touch sensor metals TE and TL disposed to overlap as described above can reduce peripheral areas (i.e. bezel areas) in which the touch sensor metals TE and TL are not disposed.

As illustrated in FIG. 14 and FIG. 15, each of the touch lines TL extends to a touch electrode TE electrically connected thereto. Alternatively, the touch lines TL may extend to the periphery of the display panel.

As described above, although each of the plurality of touch lines TL overlaps at least one touch electrode among the plurality of touch electrodes TE in the top-bottom direction, the plurality of touch lines TL and the plurality of touch electrodes TE corresponding to the touch sensor metals are disposed in different touch sensor metal layers TSML1 and TSML2, whereby each touch line TL can be electrically isolated from non-corresponding touch electrodes TE.

Specifically, although each of the plurality of touch lines TL overlaps at least one touch electrode among the plurality of touch electrodes TE, the plurality of touch lines TL are located in a different layer from the plurality of touch electrodes TE, whereby each touch line TL can be electrically connected to a touch electrode among the plurality of touch electrodes TE corresponding thereto without being electrically isolated from the non-corresponding touch electrodes TE. Thus, the touch sensor metals (touch electrodes and touch lines) can operate ordinarily, whereby touch sensing can be performed ordinarily.

In addition, the plurality of touch lines TL corresponding to the touch sensor metals are electrically isolated from each other. Furthermore, the plurality of touch lines TL do not overlap each other.

In addition, the plurality of touch electrodes TE corresponding to the touch sensor metals are electrically isolated from each other. Furthermore, the plurality of touch electrodes TE do not overlap each other.

Referring to FIG. 14 and FIG. 15, a portion in which each touch electrode TE is connected to a corresponding touch line TL through a contract hole is referred to as a bridge.

Hereinafter, two exemplary COE and M-TOE combination structures will be described, in the case that the organic light-emitting display panel 110 having a built-in touch-screen according to exemplary embodiments is designed to have the COE structure and the M-TOE structure.

Figure 16:
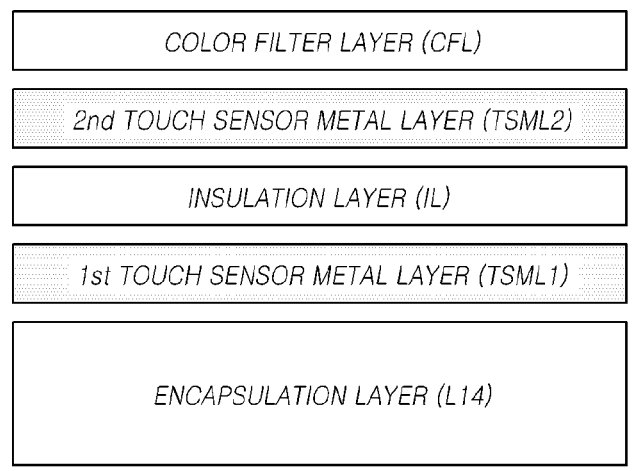
FIG. 16 is a schematic view illustrating a first COE and M-TOE combination structure in the organic light-emitting display panel having a built-in touchscreen according to exemplary embodiments.

FIG. 16 is a schematic view illustrating a first COE and M-TOE combination structure in the organic light-emitting display panel 110 having a built-in touchscreen according to exemplary embodiments.

Referring to FIG. 16, the first touch sensor metal layer TSML1, in which first touch sensor metals that may be the plurality of touch lines TL are located, is separated from the second touch sensor metal layer TSML2, in which second touch sensor metals that may be the plurality of touch electrodes TE are located, by an insulation layer IL.

Each of the touch lines TL is electrically connected to a respective touch electrode TE corresponding thereto, through a contact hole (located in a bridge) extending through the insulation layer IL.

The first touch sensor metal layer TSML1, insulation layer IL, and the second touch sensor metal layer TSML2 form a built-in touchscreen panel.

The first touch sensor metal layer TSML1, insulation layer IL, and the second touch sensor metal layer TSML2 are disposed between the encapsulation layer L14 and the color filter layer CFL.

Thus, the encapsulation layer L14, the built-in touchscreen panel TSML1, IL, and TSML2, and the color filter layer CFL are sequentially layered.

Since the color filter layer CFL is located outward of the built-in touchscreen panel TSML1, IL, and TSML2 as described above, light that has been color-converted in the color filter layer CFL can be prevented from being distorted in the built-in touchscreen TSML1, IL, and TSML2. It is therefore possible to reduce the influence of the touch sensing structure on display performance.

Figure 17:
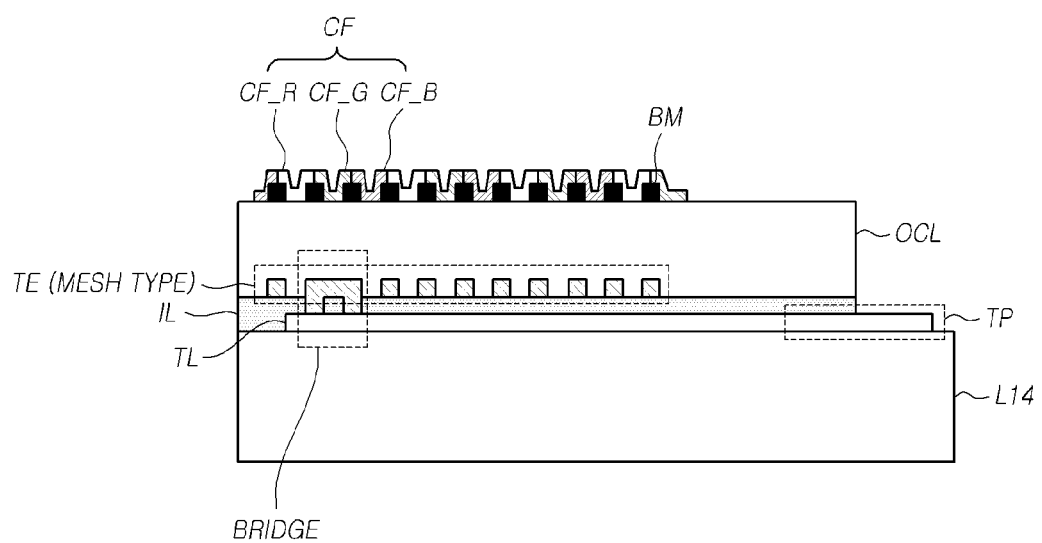
FIG. 17 is a cross-sectional view illustrating the first COE and M-TOE combination structure in the organic light-emitting display panel having a built-in touchscreen according to exemplary embodiments.

FIG. 17 is a cross-sectional view illustrating the first COE and M-TOE combination structure in the organic light-emitting display panel 110 having a built-in touchscreen according to exemplary embodiments.

Referring to FIG. 17, an overcoat layer OCL is disposed between the encapsulation layer L14 and the color filter layer CFL comprised of a plurality of patterned color filters CF.

In the color filter layer CFL, each of the subpixels SP may have a color filter CF disposed therein, the color of the color filter CF corresponding to the color of the subpixel.

For example, when subpixels generating red light, subpixels generating green light, and subpixels generating blue light are disposed in the organic light-emitting display panel 110 having a built-in touchscreen, red color filters CF_R, green color filters CF_G, and blue color filters CF_B are disposed in the color filter layer CFL.

Black matrices BM may be respectively located between two adjacent subpixels SP.

Referring to FIG. 17, the plurality of touch electrodes TE and the plurality of touch lines TL are disposed between the encapsulation layer L14 and the overcoat layer OCL.

FIG. 17 illustrates a single touch electrode among the plurality of mesh-type touch electrodes TE illustrated in FIG. 14, the single touch electrode TE being closest to a touch pad TP, and a single touch line TL electrically connected to the single mesh-type touch electrode TE through a contact hole in the bridge.

The positions of the open areas of the mesh-type touch electrodes TE illustrated in FIG. 17 correspond to the positions of the light-emitting areas of the subpixels.

The positions of the light-emitting areas of the subpixels correspond to the positions of the first electrodes E1 of the subpixels, as well as the positions of the color filters CF corresponding to the subpixels.

Referring to FIG. 17, the first touch sensor metal layer TSML1 in which the plurality of touch lines TL are disposed, the insulation layer IL, and the second touch sensor metal layer TSML2 in which the plurality of touch electrodes TE are disposed, are disposed between the encapsulation layer L14 and the overcoat layer OCL.

That is, the built-in touchscreen panel, including the first touch sensor metal layer TSML1, the insulation layer IL, and second touch sensor metal layer TSML2, is disposed between the encapsulation layer L14 and the overcoat layer OCL.

More specifically, the plurality of touch lines TL are disposed in the first touch sensor metal layer TSML1 on the encapsulation layer L14. The insulation layer IL is disposed on the first touch sensor metal layer TSML1. In addition, the plurality of touch electrodes TE are disposed in the second touch sensor metal layer TSML2 on the insulation layer IL.

The overcoat layer OCL is disposed on the second touch sensor metal layer TSML2.

Referring to FIG. 17, the touch pads TP are located on the outer ends of the plurality of touch lines TL, respectively, in the first touch sensor metal layer TSML1, and are electrically connected to the touch sensing circuit TSC.

Figure 18:
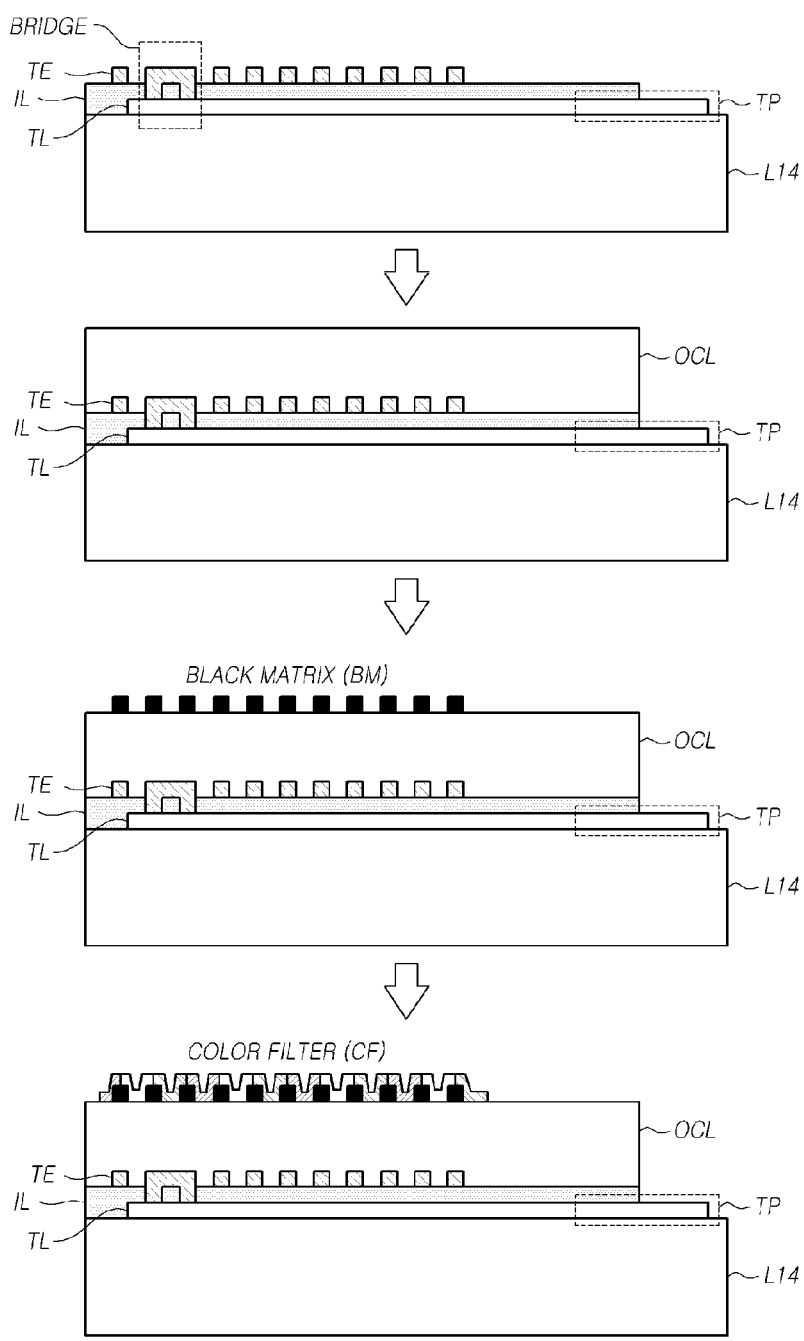
FIG. 18 is a schematic view illustrating the process steps of fabricating the first COE and M-TOE combination structure in the organic light-emitting display panel having a built-in touchscreen according to exemplary embodiments.

FIG. 18 is a schematic view illustrating the process steps of fabricating the first COE and M-TOE combination structure in the organic light-emitting display panel 110 having a built-in touchscreen according to exemplary embodiments.

Referring to FIG. 18, after the encapsulation layer L14 is formed to have the structure illustrated in FIG. 10, a built-in touchscreen panel is fabricated on the encapsulation layer L14.

That is, the touch lines TL are disposed on the first touch sensor metal layer TSML1 on the encapsulation layer L14.

The outer ends of the touch lines TL may act as the touch pads TP electrically connected to the touch sensing circuit TSC.

An insulation layer IL is formed on the first touch sensor metal layer TSML1, and the plurality of touch electrodes TE are formed on the insulation layer IL to be located in the second touch sensor metal layer TSML2.

Afterwards, the encapsulation layer L14 on which the built-in touchscreen panel is fabricated is covered with an overcoat layer OCL.

Here, specific portions of the touch sensor metals TE, TL, and TP forming the built-in touchscreen panel are exposed to be connected to the touch sensing circuit TSC, the specific portions corresponding to the touch pads TP.

Afterwards, black matrices BM are formed on the overcoat layer OCL, in positions corresponding to the boundaries of the subpixels Afterwards, the color filters CF corresponding to the light-emitting areas of the subpixels are patterned.

Since the overcoat layer OCL is formed on the touch sensor metals, such as the touch lines TL, and the touch pads TP, and the touch electrodes TE, as described above, it is possible to protect the touch sensor metals TE and TL using the overcoat layer OCL.

Figure 19:
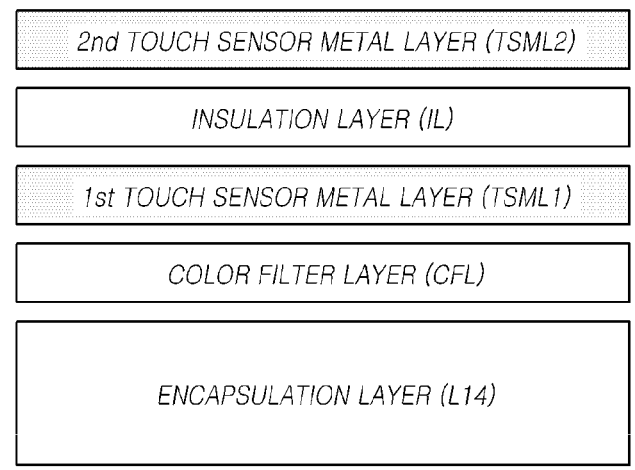
FIG. 19 is a schematic view illustrating a second COE and M-TOE combination structure in the organic light-emitting display panel having a built-in touchscreen according to exemplary embodiments.

FIG. 19 is a schematic view illustrating a second COE and M-TOE combination structure in the organic light-emitting display panel 110 having a built-in touchscreen according to exemplary embodiments.

Referring to FIG. 19, the touch sensor metals, including the plurality of touch electrodes TE and the plurality of touch lines TL, are disposed on the color filter layer CFL.

That is, the encapsulation layer L14, the color filter layer CFL, and the touch sensor metals TE, TL, and TP are sequentially layered.

More specifically, the first touch sensor metal layer TSML1 in which the plurality of touch lines TL are disposed is located on the color filter layer CFL, which is disposed on the encapsulation layer L14.

The insulation layer IL is located on the first touch sensor metal layer TSML1 in which the plurality of touch lines TL are disposed, and the second touch sensor metal layer TSML2 in which the plurality of touch electrodes TE are disposed is located on the insulation layer IL.

Here, the first touch sensor metal layer TSML1 in which the plurality of touch lines TL are disposed, the insulation layer IL, the second touch sensor metal layer TSML2 in which the plurality of touch electrodes TE are disposed correspond to the built-in touchscreen panel disposed within the organic light-emitting display panel 110.

As described above, after the entirety of the patterns related to the display function, such as the encapsulation layer L14 and the color filter layer CFL, are formed, the touch sensor metals (e.g. the touch electrodes TE) are formed to be close to the outermost portion. Then, the distance between the touch pointer of the user to a touch electrode TE corresponding thereto may be reduced, thereby increasing the level of capacitance between the pointer and the corresponding touch electrode TE. Consequently, the accuracy of the operation of sensing a touch and a touched position can be improved.

Figure 20:
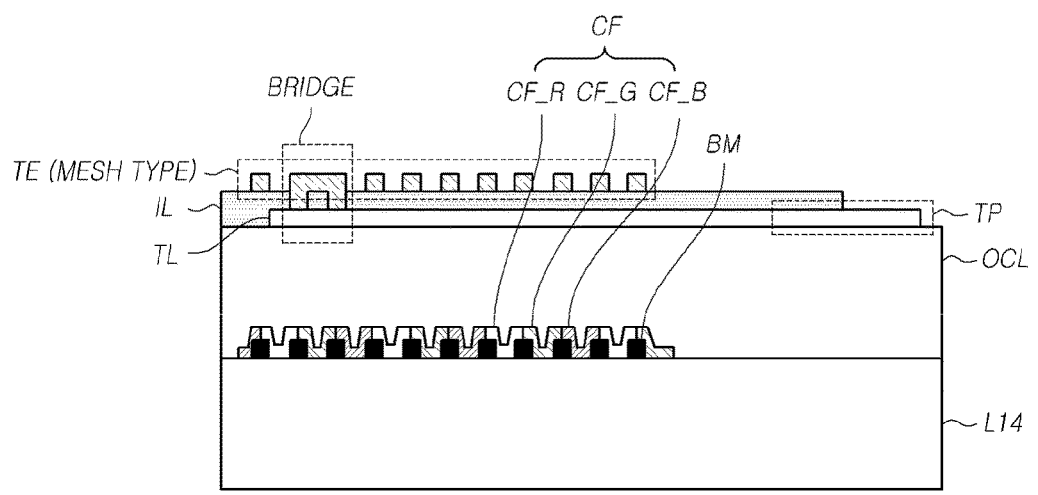
FIG. 20 is a cross-sectional view illustrating a second COE and M-TOE combination structure in the organic light-emitting display panel having a built-in touchscreen according to exemplary embodiments.

FIG. 20 is a cross-sectional view illustrating a second COE and M-TOE combination structure in the organic light-emitting display panel having a built-in touchscreen according to exemplary embodiments.

Referring to FIG. 20, the overcoat layer OCL is further disposed on the color filter layer CFL formed by patterning a plurality of color filters CF on the encapsulation layer L14.

In the color filter layer CFL, each of the subpixels SP may have a color filter CF disposed therein, the color of the color filter CF corresponding to the color of the subpixel.

For example, when subpixels generating red light, subpixels generating green light, and subpixels generating blue light are disposed in the organic light-emitting display panel 110 having a built-in touchscreen, red color filters CF_R, green color filters CF_G, and blue color filters CF_B are disposed in the color filter layer CFL.

Black matrices BM may be respectively located between two adjacent subpixels SP.

Referring to FIG. 20, as described above, the overcoat layer OCL is disposed on the color filters CF.

In addition, the touch sensor metals, including the plurality of touch electrodes TE, the plurality of touch lines TL, and the plurality of touch pads TP, are disposed on the overcoat layer OCL.

More specifically, the first touch sensor metal layer TSML1 in which the plurality of touch lines TL are disposed, the insulation layer IL, and the second touch sensor metal layer TSML2 in which the plurality of touch electrodes TE are disposed are disposed on the overcoat layer OCL.

The touch pads TP that may be connected to the touch lines TL or may be portions of the touch lines TL are located in the first touch sensor metal layer TSML1.

In addition, the touch electrodes TE located in the second touch sensor metal layer TSML2 are electrically connected to the touch lines TL, located in the first touch sensor metal layer TSML1, through contact holes in the bridge area.

FIG. 20 illustrates a single mesh-type touch electrode among the plurality of mesh-type touch electrodes TE illustrated in FIG. 14, the single touch electrode TE being closest to a touch pad TP, and a single touch line TL electrically connected to the single mesh-type touch electrode TE through a contact hole in the bridge.

The positions of the mesh-type touch electrodes TE illustrated in FIG. 20 correspond to the positions of the light-emitting areas of the subpixels.

The positions of the light-emitting areas of the subpixels correspond to the positions of the first electrodes E1 of the subpixels, as well as the positions of the color filters CF corresponding to the subpixels.

Figure 21:
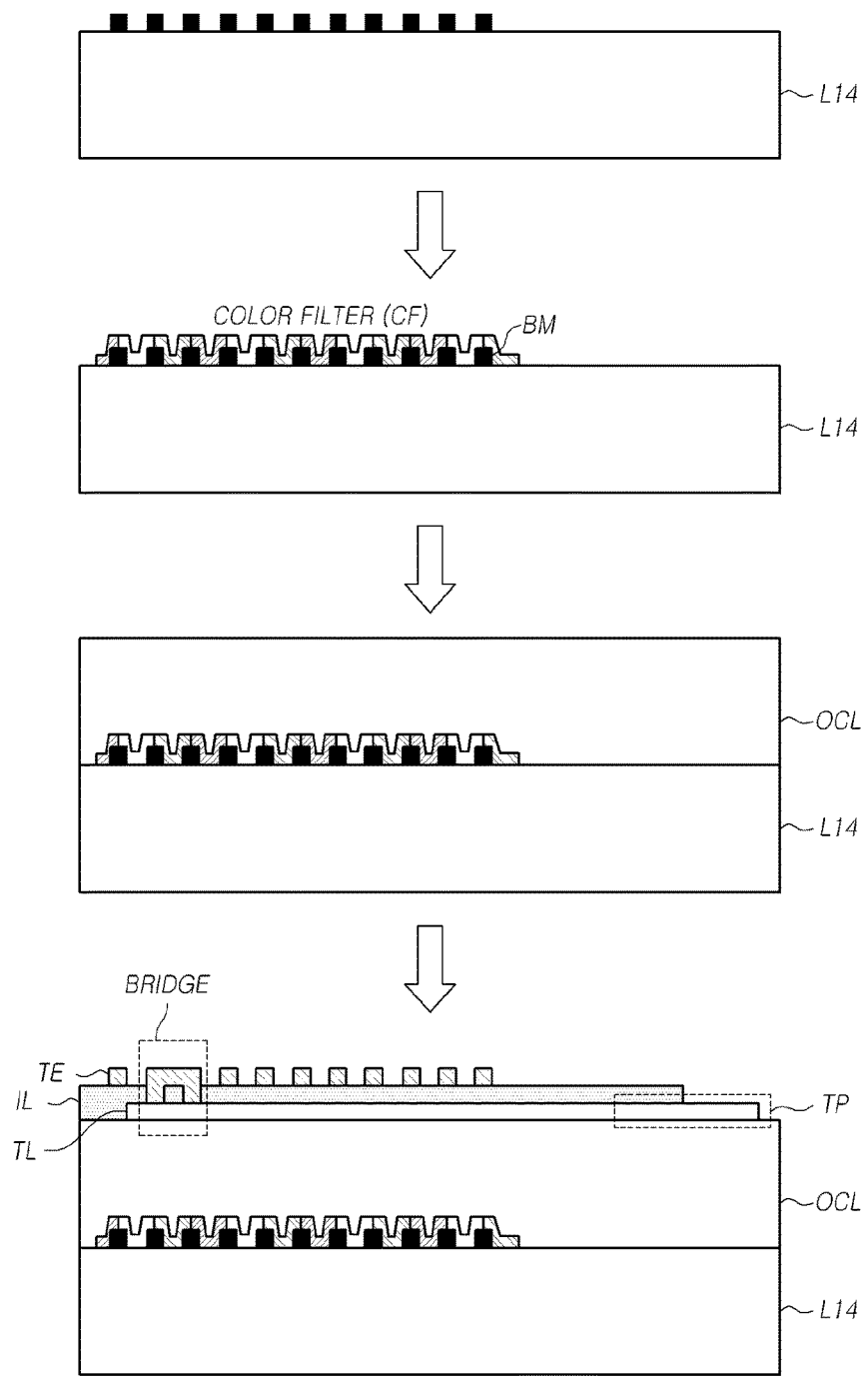
FIG. 21 is a schematic view illustrating the process steps of fabricating the second COE and M-TOE combination structure in the organic light-emitting display panel having a built-in touchscreen according to exemplary embodiments.

FIG. 21 is a schematic view illustrating the process steps of fabricating the second COE and M-TOE combination structure in the organic light-emitting display panel 110 having a built-in touchscreen according to exemplary embodiments.

Referring to FIG. 21, after the encapsulation layer L14 is formed to have the structure illustrated in FIG. 10, the black matrices BM are formed on boundaries of the subpixels.

Afterwards, the color filters CF corresponding to the light-emitting areas of the subpixels are patterned.

The encapsulation layer L14, with the color filters CF and the black matrices BM patterned thereon, is covered with the overcoat layer OCL.

Afterwards, a built-in touchscreen panel is formed on the overcoat layer OCL.

The touch electrodes TE, the touch lines TL, and the touch pads TP corresponding to the touch sensor metals forming the built-in touchscreen panel are formed on the overcoat layer OCL.

More specifically, the touch lines TL are located in the first touch sensor metal layer TSML1 on the overcoat layer OCL, the insulation layer IL is located on the first touch sensor metal layer TSML1, and the touch electrodes TE are located in the second touch sensor metal layer TSML2 on the insulation layer IL.

The touch electrodes TE located in the second touch sensor metal layer TSML2 are electrically connected to the touch lines TL, located in the first touch sensor metal layer TSML1, through the contact holes in the bridge area.

In addition, the touch pads TP connected to the touch lines TL or the touch pads TP corresponding to portions of the touch lines TL are located in the first touch sensor metal layer TSML1.

As described above, the overcoat layer OCL is formed on the color filter layer CFL, and the touch sensor metals TE, TL, and TP are formed on the overcoat layer OCL. It is thereby possible to protect the color filter layer CFL and the patterns below the color filter layer CFL using the overcoat layer OCL. In addition, the overcoat layer OCL can prevent the touch electrodes TE, the touch lines TL, and the like from electrically interfering with electrodes, voltage lines, or signal lines located below the overcoat layer OCL.

Figure 22:
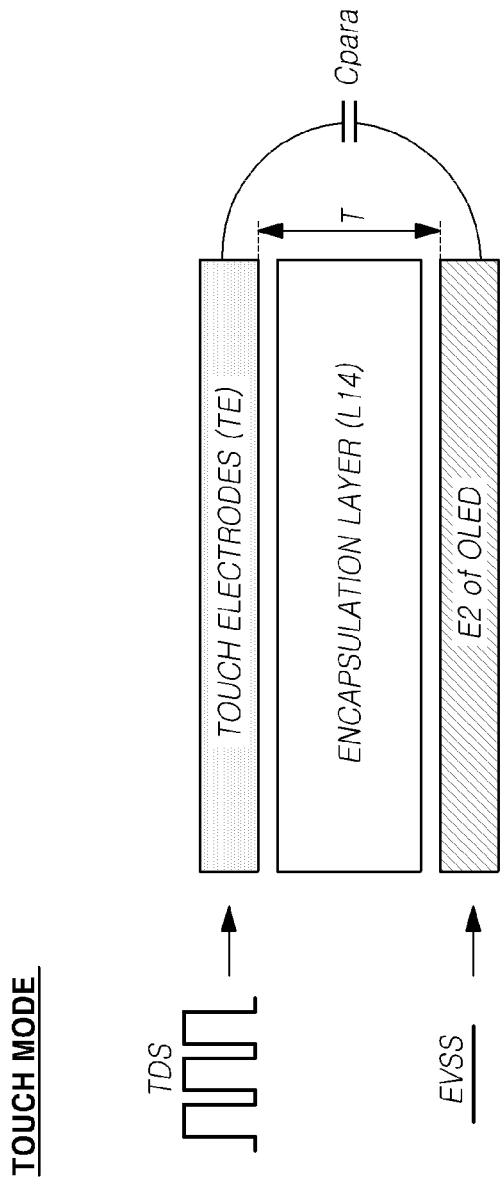
FIG. 22 is a schematic view illustrating the distance defined between the touch electrode and the second electrode and a parasitic capacitance component formed between the touch electrode and the second electrode in the organic light-emitting display panel having a built-in touchscreen according to exemplary embodiments.

FIG. 22 is a schematic view illustrating the distance T defined between the touch electrode TE and the second electrode E2 and a parasitic capacitance component formed between the touch electrode TE and the second electrode E2 in the organic light-emitting display panel 110 having a built-in touchscreen according to exemplary embodiments.

Referring to FIG. 22, during the touch mode section, a touch driving signal TDS is applied to the touch electrode TE.

Here, a base voltage EVSS is applied to the second electrode E2 (e.g. cathode) of the OLED.

The base voltage EVSS may be a DC voltage having a ground voltage value or a specific voltage value.

Referring to FIG. 22, the encapsulation layer L14 is disposed between the touch electrode TE and the second electrode E2 of the OLED.

Referring to the structure illustrated in FIG. 17, the encapsulation layer L14 is disposed between the touch electrode TE and the second electrode E2 of the OLED.

Referring to the structure illustrated in FIG. 20, the encapsulation layer L14 and the overcoat layer OCL are disposed between the touch electrode TE and the second electrode E2 of the OLED.

Referring to FIG. 22, during the touch mode section, parasitic capacitance Cpara may be formed between the touch electrode TE to which the touch driving signal TDS is applied and the second electrode E2 to which the base voltage EVSS is applied.

The parasitic capacitance Cpara acts as a load increasing RC delay regarding the touch electrode TE and the touch line TL.

In addition, during the touch mode section, the parasitic capacitance Cpara may change sensing data obtained from a signal received from the touch electrode TE to which the touch driving signal TDS is applied, thereby forming a touch sensing error.

Accordingly, the organic light-emitting display panel 110 having a built-in touchscreen according to exemplary embodiments may have a structural feature able to prevent the parasitic capacitance Cpara. This feature will be described with reference to FIG. 23, FIG. 24, and FIG. 25.

Figure 23:
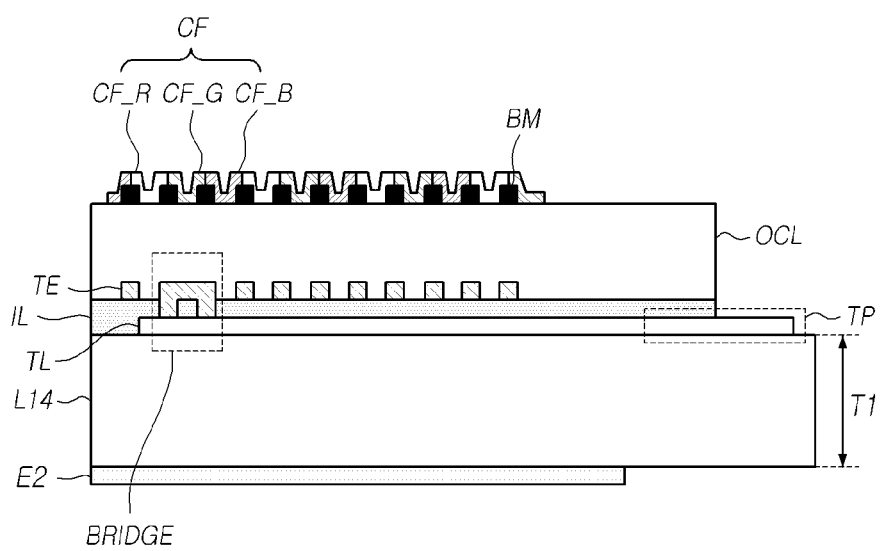
FIG. 23 is a schematic view illustrating the distance between the touch electrode TE and the second electrode in the organic light-emitting display panel having a built-in touchscreen and a first COE and M-TOE combination structure.
Figure 24:
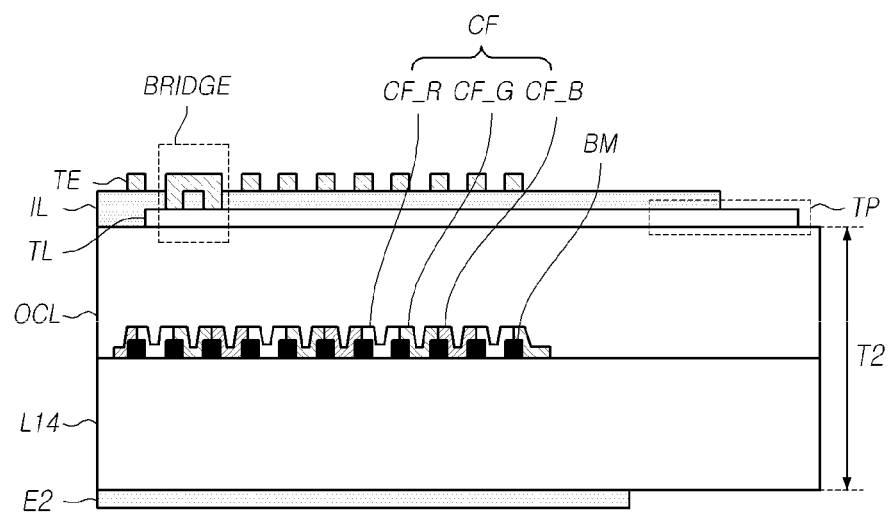
FIG. 24 is a schematic view illustrating the distance between the touch electrode and the second electrode in the organic light-emitting display panel having a built-in touchscreen and a second COE and M-TOE combination structure.
Figure 25:
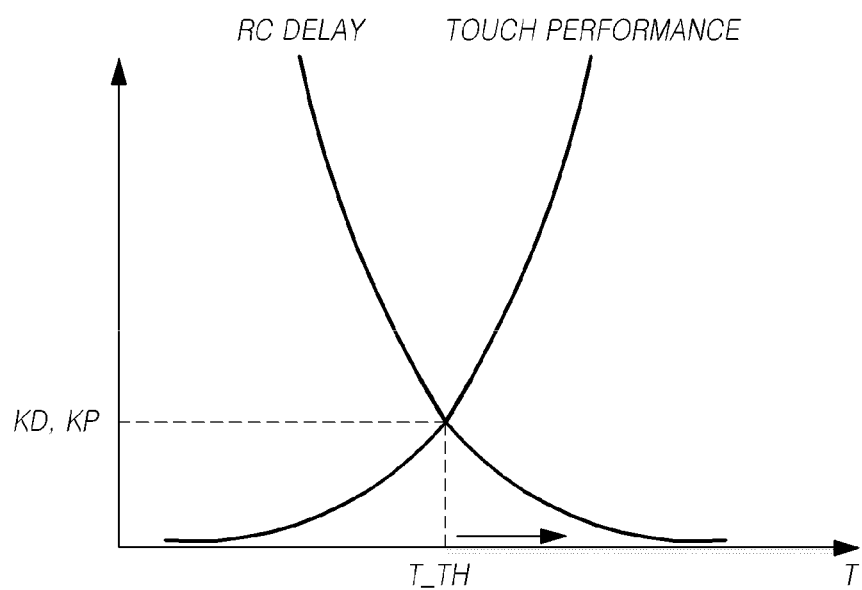
FIG. 25 is a graph illustrating RC delay and touch sensing performance according to the distance between the touch electrode and the second electrode in the organic light-emitting display panel having a built-in touchscreen according to exemplary embodiments.

FIG. 23 is a schematic view illustrating the distance T1 between the touch electrode TE and the second electrode E2 in the organic light-emitting display panel 110 having a built-in touchscreen and a first COE and M-TOE combination structure, FIG. 24 is a schematic view illustrating the distance T2 between the touch electrode TE and the second electrode E2 in the organic light-emitting display panel 110 having a built-in touchscreen and a second COE and M-TOE combination structure, and FIG. 25 is a graph illustrating RC delay and touch sensing performance according to the distance T between the touch electrode TE and the second electrode E2 in the organic light-emitting display panel 110 having a built-in touchscreen according to exemplary embodiments.

Referring to FIG. 23, in the organic light-emitting display panel 110 having a built-in touchscreen and a first COE and M-TOE combination structure, the distance T1 between the touch electrode TE and the second electrode E2 corresponds to the thickness of the encapsulation layer L14.

Referring to FIG. 24, in the organic light-emitting display panel 110 having a built-in touchscreen and a second COE and M-TOE combination structure, the distance T2 between the touch electrode TE and the second electrode E2 corresponds to a total of the thickness of the encapsulation layer L14 and the thickness of the overcoat layer OCL.

Referring to FIG. 25, in the organic light-emitting display panel 110 having a built-in touchscreen and an M-TOE structure, a decrease in the distance T between the touch electrode TE and the second electrode E2 increases the parasitic capacitance Cpara between the second electrode E2 and the touch electrode TE, thereby increasing RC delay and lowering touch sensing performance (touch sensitivity).

Referring to FIG. 25, in the organic light-emitting display panel 110 having a built-in touchscreen and an M-TOE structure, an increase in the distance T between the touch electrode TE and the second electrode E2 reduces the parasitic capacitance Cpara between the second electrode E2 and the touch electrode TE, thereby decreasing RC delay and improving touch sensing performance (touch sensitivity).

As described above, the distance T between the touch electrode TE and the second electrode E2 must be equal to or greater than a threshold thickness T_TH corresponding to maximum allowable RC delay KD and minimum touch sensing performance KP.

Accordingly, in the organic light-emitting display panel 110 having a built-in touchscreen in which the first COE and M-TOE combination structure illustrated in FIG. 23 is provided, the encapsulation layer L14 must be formed to be relatively thick, such that the distance T1 between the touch electrode TE and the second electrode E2 is equal to or greater than the threshold thickness T_TH.

In the organic light-emitting display panel 110 having a built-in touchscreen in which the second COE and M-TOE combination structure illustrated in FIG. 24 is provided, the encapsulation layer L14 and the overcoat layer OCL must be formed to be relatively thick such that the distance T2 between the touch electrode TE and the second electrode E2 is equal to or greater than the threshold thickness T_TH.

For example, the distance T1 between the touch electrode TE and the second electrode E2 in the organic light-emitting display panel 110 having a built-in touchscreen in which the first COE and M-TOE combination structure illustrated in FIG. 23 is provided or the distance T2 between the touch electrode TE and the second electrode E2 in the organic light-emitting display panel 110 having a built-in touchscreen in which the second COE and S-TOE combination structure illustrated in FIG. 24 is provided may be equal to the distance between the plurality of touch electrodes TE and the bottom surface of the encapsulation layer L14 (i.e. the top surface of the second electrode E2). Here, the threshold thickness T_TH may be 5 μm.

That is, the distance between the plurality of touch electrodes TE and the bottom surface of the encapsulation layer L14 (i.e. the top surface of the second electrode E2) may be designed to be equal to or greater than 5 μm.

This can consequently reduce RC delay and improve touch sensing performance.

In addition, each of the high-resistance black matrices BM is disposed between two adjacent color filters among the color filters CF in the color filter layer CFL. The resistance of the high-resistance black matrices BM is equal to or higher than a predetermined level of resistance.

Due to the high-resistance black matrices BM disposed as described above, the touch sensor metals can be reliably disposed within the organic light-emitting display panel 110 including an organic material.

As described above, the distance between the second electrode E2 and the touch electrode TE (i.e. the distance between the bottom surface of the encapsulation layer L14 and the touch electrode TE) is designed to be equal to or greater than a predetermined value T_TH of, for example, 5 μm, whereby the parasitic capacitance Cpara can be prevented from being formed between the second electrode E2 and the touch electrode TE.

As described above, the structural design change (e.g. the changed thickness) can prevent the parasitic capacitance Cpara from being formed between the second electrode E2 and the touch electrode TE. Alternatively, load-free driving performed during the touch mode section can prevent the parasitic capacitance Cpara from being formed between the second electrode E2 and the touch electrode TE.

Figure 26:
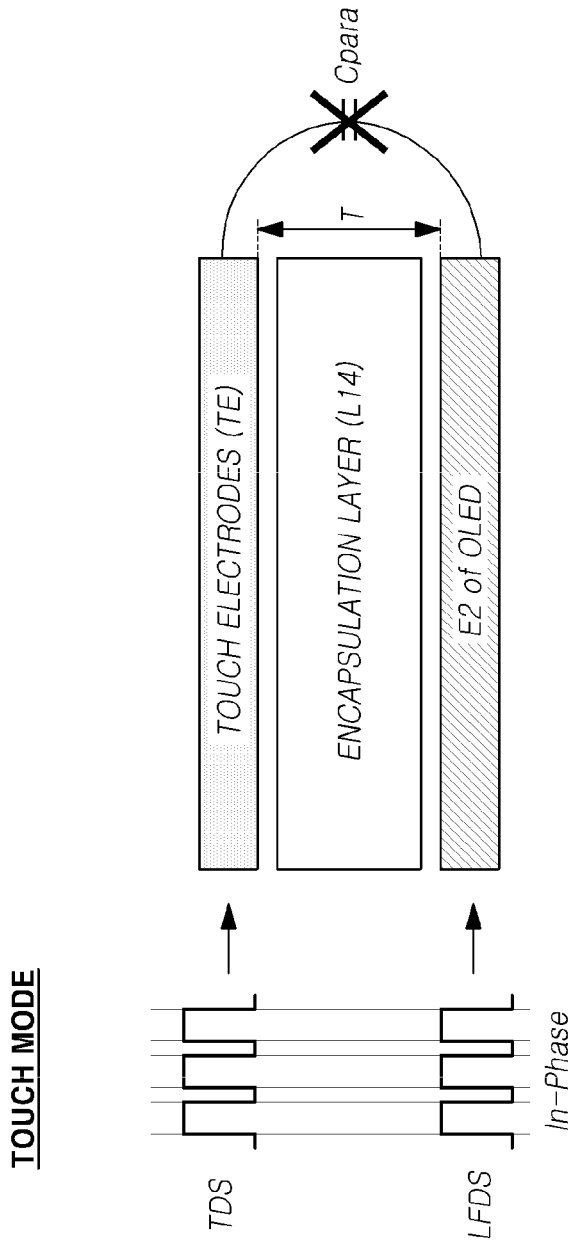
FIG. 26 is a schematic view illustrating load-free driving for removing a parasitic capacitance component from the organic light-emitting display device having a built-in touchscreen according to exemplary embodiments.

FIG. 26 is a schematic view illustrating load-free driving for removing a parasitic capacitance component from the organic light-emitting display device 100 having a built-in touchscreen according to exemplary embodiments.

As illustrated in FIG. 26, during the touch mode section, the organic light-emitting display device 100 having a built-in touchscreen according to exemplary embodiments performs load-free driving of applying a load-free driving signal LFDS to the second electrode E2 to reduce the potential difference between the second electrode E2 and the touch electrode TE, thereby being able to prevent parasitic capacitance Cpara from being formed between the second electrode E2 and the touch electrode TE.

Here, the load-free driving signal LFDS may be a signal identical to the touch driving signal TDS or a signal corresponding to the touch driving signal TDS.

When the load-free driving signal TDS is identical to the touch driving signal TDS, at least one of the frequency, phase, and amplitude of the load-free driving signal TDS may be identical to a corresponding one of the frequency, phase, and amplitude of the touch driving signal TDS.

While the load-free driving signal TDS and the touch driving signal TDS are being transferred in the organic light-emitting display panel 110 having a built-in touchscreen, signal characteristics may be changed due to, for example, signal amplitude attenuation. The degree of change may vary according to positions.

In this regard, the signal output characteristics of the organic light-emitting display device 100 having a built-in touchscreen can be controlled such that at least one of the frequency, phase, and amplitude of the load-free driving signal TDS becomes identical to a corresponding one of the frequency, phase, and amplitude of the touch driving signal TDS at a point at which the load-free driving signal TDS is actually applied to the second electrode E2 and a point at which the touch driving signal TDS is actually applied to the touch electrode TE.

Thus, when the signal output characteristics of the load-free driving signal TDS and the touch driving signal TDS are controlled by a signal output configuration such that at least one of the frequency, phase, and amplitude of the load-free driving signal TDS becomes identical to a corresponding one of the frequency, phase, and amplitude of the touch driving signal TDS at the point at which the load-free driving signal TDS is actually applied to the second electrode E2 and the point at which the touch driving signal TDS is actually applied to the touch electrode TE, at least one of the frequency, phase, and amplitude of the load-free driving signal TDS may differ from a corresponding one of the frequency, phase, and amplitude of the touch driving signal TDS at a point at which the load-free driving signal TDS and the touch driving signal TDS are output.

According to the exemplary embodiments as set forth above, the organic light-emitting display panel 110 having a built-in touchscreen and the organic light-emitting display device 100 having a built-in touchscreen are provided with a structure enabling a touchscreen panel (i.e. touch sensor metals) to be disposed therewithin.

In addition, according to the exemplary embodiments, the organic light-emitting display panel 110 having a built-in touchscreen and the organic light-emitting display device 100 having a built-in touchscreen can improve touch sensing performance.

Furthermore, according to the exemplary embodiments, the organic light-emitting display panel 110 having a built-in touchscreen and the organic light-emitting display device 100 having a built-in touchscreen are provided with a structure enabling an ultrathin profile to be designed.

In addition, according to the exemplary embodiments, the organic light-emitting display panel 110 having a built-in touchscreen and the organic light-emitting display device 100 having a built-in touchscreen are provided with a touchscreen panel (i.e. touch sensor metals) disposed therewithin without display performance being influenced.

Furthermore, according to the exemplary embodiments, the organic light-emitting display panel 110 having a built-in touchscreen and the organic light-emitting display device 100 having a built-in touchscreen are provided with an M-TOE structure in which two touch sensor metals (touch electrodes and touch lines) are disposed in different layers, the touch sensor metals enabling self-capacitance based touch sensing.

The foregoing descriptions and the accompanying drawings have been presented in order to explain the certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure.

It should be understood that the scope of the disclosure shall be defined by the appended Claims and all of their equivalents fall within the scope of the disclosure.

What is claimed is:

1. An organic light-emitting display device comprising:
   an organic light-emitting display panel having a built-in touchscreen, wherein the organic light-emitting display panel comprises a plurality of subpixels defined therein by a plurality of data lines and a plurality of gate lines and a plurality of touch electrodes disposed thereon; and
   a touch sensing circuit supplying a touch driving signal to at least one touch electrode among the plurality of touch electrodes and sensing at least one of a touch and a touched position based on a signal detected using each of the plurality of touch electrodes to which the touch driving signal is applied,
   wherein the organic light-emitting display panel further comprises:
      an encapsulation layer over at least one of the plurality of subpixels;
      a plurality of touch lines formed along an upper surface of the encapsulation layer, the plurality of touch lines electrically connecting the plurality of touch electrodes to the touch sensing circuit; and
      an insulation layer between the plurality of touch lines and the plurality of touch electrodes, wherein the plurality of touch electrodes are on the insulation layer.

2. The organic light-emitting display device according to claim 1, further comprising:
   a color filter layer located on the encapsulation layer.

3. The organic light-emitting display device according to claim 1, wherein each of the plurality of touch lines electrically connected to a corresponding touch electrode of the plurality of touch electrodes through a contact hole and each of the plurality of touch lines electrically isolated from the remaining touch electrodes.

4. The organic light-emitting display device according to claim 3, wherein each of the plurality of touch lines overlaps at least one touch electrode of the plurality of touch electrodes.

5. The organic light-emitting display device according to claim 3, further comprising:
   a touch pad disposed on the periphery of the organic light-emitting display panel; and
   an overcoat layer disposed on the plurality of touch electrodes,
   wherein the overcoat layer overlaps with the at least the part of the touch pad.

6. The organic light-emitting display device according to claim 3, wherein the plurality of touch electrodes are disposed between the encapsulation layer and the color filter layer.

7. The organic light-emitting display device according to claim 6, wherein the organic light-emitting display panel further comprises:
   an overcoat layer disposed between the encapsulation layer and the color filter layer, and the plurality of touch electrodes are disposed between the encapsulation layer and the overcoat layer.

8. The organic light-emitting display device according to claim 1, wherein the organic light-emitting display panel further comprises at least one second electrode disposed on the plurality of subpixels
   wherein a load-free driving signal is applied to the at least one second electrode in a touch mode section and a base voltage is applied to the at least one second electrode in a section or remaining sections except for the touch mode section.

9. The organic light-emitting display device according to claim 1, wherein each of the plurality of touch electrodes comprises a bulk-type transparent electrode without an open area.

10. The organic light-emitting display device according to claim 1, wherein each of the plurality of touch electrodes comprises a mesh-type transparent or opaque electrode having an open area.

11. The organic light-emitting display device according to claim 1, wherein a size of each of the plurality of touch electrodes is greater than a size of each of the plurality of subpixels.

12. The organic light-emitting display device according to claim 11, wherein two or more gate lines among the plurality of gate lines or two or more data lines among the plurality of data lines are disposed in an area occupied by each of the plurality of touch electrodes.

13. An organic light-emitting display panel having a built-in touchscreen, the organic light-emitting display panel comprising:
   a plurality of subpixels defined therein by a plurality of data lines and a plurality of gate lines and a touch sensor built therein, wherein each of the plurality of subpixels comprises:
      an organic light-emitting diode comprising a first electrode, an organic light-emitting layer, and a second electrode;
      a driving transistor driving the organic light-emitting diode;
      a first transistor electrically connected between a first node of the driving transistor and a data line among the plurality of data lines corresponding thereto; and
      a storage capacitor electrically connected between the first node and a second node of the driving transistor,
   wherein the organic light-emitting display panel further comprises:
      an encapsulation layer located on the second electrode of the organic light-emitting diode of at least one of the plurality of subpixels;
      a plurality of touch lines formed along an upper surface of the encapsulation layer;
      a plurality of touch electrodes corresponding to the touch sensor, the plurality of touch electrodes electrically connected to the plurality of touch lines,
      an insulation layer between the plurality of touch lines and the plurality of touch electrodes;
   wherein a touch driving signal is supplied to at least one touch electrode among the plurality of touch electrodes, and
   wherein the touch electrode to which the touch driving signal is applied forms capacitance together with a pointer corresponding to a touch operation means of a user.

14. The organic light-emitting display panel according to claim 13, further comprising a color filter layer disposed on the encapsulation layer.

15. The organic light-emitting display panel according to claim 14, wherein
   each of the plurality of touch lines is electrically connected to a corresponding touch electrode of the plurality of touch electrodes through a contact hole and is electrically isolated from the remaining touch electrodes.

16. The organic light-emitting display panel according to claim 15, wherein each of the plurality of touch lines overlaps at least one touch electrode of the plurality of touch electrodes.

17. The organic light-emitting display panel according to claim 15, wherein
the plurality of touch lines are disposed in a first touch sensor metal layer that is in contact with the encapsulation layer,
the insulation layer is disposed on the first touch sensor metal layer,
the plurality of touch electrodes are disposed in a second touch sensor metal layer on the insulation layer, and
a touch pad is provided on each outer end of the plurality of touch lines, the touch pad being electrically connected to the touch sensing circuit and located in the first touch sensor metal layer.

18. The organic light-emitting display panel according to claim 14, wherein the plurality of touch electrodes are disposed between the encapsulation layer and the color filter layer.

19. The organic light-emitting display panel according to claim 18, further comprising an overcoat layer disposed between the encapsulation layer and the color filter layer, wherein the plurality of touch electrodes are disposed between the encapsulation layer and the overcoat layer.

20. The organic light-emitting display panel according to claim 14, further comprising:
a black matrix disposed between two adjacent color filters in the color filter layer, a resistance of the black matrix having being equal to or higher than a predetermined level of resistance.

21. The organic light-emitting display panel according to claim 13, further comprising:
at least one second electrode disposed on the encapsulation layer such that the encapsulation layer is disposed between the at least one touch electrode and the at least one second electrode, wherein a load-free driving signal is applied to the at least one second electrode in a touch mode section and a base voltage is applied to the at least one second electrode in a section or remaining sections except for the touch mode section.

22. The organic light-emitting display panel according to claim 13, wherein a distance between the plurality of touch electrodes and a bottom surface of the encapsulation layer is equal to or greater than 5 μm.

* * * * *